United States Patent
Monforte et al.

(10) Patent No.: US 12,348,187 B2
(45) Date of Patent: Jul. 1, 2025

(54) TECHNIQUES FOR FORECASTING SOLAR POWER GENERATION

(71) Applicant: ITRON, INC., Liberty Lake, WA (US)

(72) Inventors: Frank Monforte, San Diego, CA (US); Andrew Sukenik, San Diego, CA (US)

(73) Assignee: ITRON, INC., Liberty Lake, WA (US)

( * ) Notice: Subject to any disclaimer, the term of this patent is extended or adjusted under 35 U.S.C. 154(b) by 0 days.

(21) Appl. No.: 18/349,222

(22) Filed: Jul. 10, 2023

(65) Prior Publication Data

US 2023/0353090 A1 Nov. 2, 2023

Related U.S. Application Data

(63) Continuation of application No. 17/672,450, filed on Feb. 15, 2022, now Pat. No. 11,711,055, which is a continuation of application No. 16/421,326, filed on May 23, 2019, now Pat. No. 11,264,948, which is a continuation-in-part of application No. 16/393,136, filed on Apr. 24, 2019, now Pat. No. 11,651,311.

(60) Provisional application No. 62/734,189, filed on Sep. 20, 2018.

(51) Int. Cl.
*H02S 99/00* (2014.01)
*G01R 21/133* (2006.01)
*G01W 1/00* (2006.01)

(52) U.S. Cl.
CPC ............ *H02S 99/00* (2013.01); *G01R 21/133* (2013.01); *G01W 1/00* (2013.01)

(58) Field of Classification Search
CPC ....... H02S 99/00; H02S 50/00; G01R 21/133; G01W 1/00
See application file for complete search history.

(56) References Cited

U.S. PATENT DOCUMENTS

| | | | |
|---|---|---|---|
| RE29,476 E | 11/1977 | Monforte et al. | |
| 9,320,926 B2* | 4/2016 | Ryba-White | ............ E04B 1/941 |
| 9,411,073 B1 | 8/2016 | Hoff | |
| 9,638,831 B1 | 5/2017 | Hoff | |

(Continued)

FOREIGN PATENT DOCUMENTS

| | | | | |
|---|---|---|---|---|
| CN | 102566435 B | 10/2013 | | |
| JP | 5466596 B2 * | 4/2014 | ............ | Y02E 10/50 |
| WO | 2015/0104281 A1 | 7/2015 | | |

OTHER PUBLICATIONS

Notice of Allowance received for U.S. Appl. No. 18/301,171 dated Jun. 6, 2024, 9 pages.

(Continued)

*Primary Examiner* — Tung S Lau

(74) *Attorney, Agent, or Firm* — Artegis Law Group, LLP

(57) ABSTRACT

Techniques for forecasting solar power generation include determining, by a computing device, one or more configuration parameters of a photovoltaic (PV) installation; selecting, by the computing device based on the one or more configuration parameters, a prototype PV installation from a plurality of prototype PV installations; generating, by the computing device, a clear-sky solar power generation level for the selected prototype PV installation; and scaling, by the computing device, the clear-sky solar power generation level for the selected prototype PV installation to generate an estimated clear-sky solar power generation level for the PV installation.

20 Claims, 12 Drawing Sheets

(56) References Cited

U.S. PATENT DOCUMENTS

| | | | |
|---|---|---|---|
| 9,645,180 B1 | 5/2017 | Hoff | |
| 10,523,012 B2 | 12/2019 | Macerini | |
| 10,797,639 B1 | 10/2020 | Hoff | |
| 11,264,948 B2* | 3/2022 | Monforte | H02S 99/00 |
| 11,651,311 B2* | 5/2023 | Monforte | H02J 13/00022 |
| | | | 703/18 |
| 11,711,055 B2* | 7/2023 | Monforte | G01R 21/133 |
| | | | 702/3 |
| 2010/0000519 A1* | 1/2010 | Zalusky | F24S 30/48 |
| | | | 126/601 |
| 2010/0294337 A1* | 11/2010 | Sherman | G01S 3/7861 |
| | | | 136/246 |
| 2012/0097211 A1 | 4/2012 | Gurfil et al. | |
| 2012/0201601 A1* | 8/2012 | Rizzo | F24S 25/632 |
| | | | 403/409.1 |
| 2013/0166266 A1 | 6/2013 | Herzig et al. | |
| 2013/0246010 A1* | 9/2013 | Dershowitz | H02S 50/00 |
| | | | 703/1 |
| 2013/0328406 A1 | 12/2013 | Matsuura et al. | |
| 2014/0149038 A1 | 5/2014 | Cronin et al. | |
| 2014/0156322 A1 | 6/2014 | Monforte et al. | |
| 2014/0278107 A1 | 9/2014 | Kerrigan et al. | |
| 2014/0278108 A1 | 9/2014 | Kerrigan et al. | |
| 2014/0278163 A1 | 9/2014 | Tan et al. | |
| 2014/0289004 A1 | 9/2014 | Monforte et al. | |
| 2015/0073737 A1 | 3/2015 | Inuzuka | |
| 2015/0081124 A1 | 3/2015 | Ekanayake et al. | |
| 2015/0081127 A1 | 3/2015 | Bhageria et al. | |
| 2015/0189705 A1 | 7/2015 | Ghosh | |
| 2015/0310463 A1* | 10/2015 | Turfboer | G06Q 30/0204 |
| | | | 705/7.33 |
| 2016/0104138 A1* | 4/2016 | Newell | H02S 50/00 |
| | | | 705/34 |
| 2017/0357989 A1* | 12/2017 | Turfboer | G06Q 30/0204 |
| 2018/0188301 A1 | 7/2018 | McBrearty et al. | |
| 2018/0196092 A1 | 7/2018 | McBrearty et al. | |
| 2018/0262011 A1 | 9/2018 | Itaya | |
| 2018/0351364 A1 | 12/2018 | Pawlik | |
| 2019/0146540 A1 | 5/2019 | Li et al. | |
| 2022/0173697 A1* | 6/2022 | Monforte | G01W 1/00 |

OTHER PUBLICATIONS

Non Final Office Action received for U.S. Appl. No. 18/301,171, dated Jan. 11, 2024, 27 pages.

Raymer, Sarah, "PV System Site Assessment", SolPowerPeople, Inc., https://www.slideshare.net/solpowerpeople/0530 13-pv-system-site-assessment-1, May 30, 2013, 73 pages.

Vashishtha, Sanjay, "Differentiate Between the DNI, DHI and GHI?", https://firstgreenconsulting.wordpress.com/2012/04/26/differentiate-between-the-dni-dhi-and-ghi/., Apr. 26, 2012, 3 pages.

Eng Home IITACA, ITACA, https://www.itacanet.org/eng-home/, Apr. 10, 2020, 3 pages.

"NOAA Solar Calculator", National Oceanic & Atmospheric Administration, https://www.esrl.noaa.gov/gmd/grad/solcalc/, Apr. 18, 2020, 2 pages.

"PVWatts Calculator", National Renewable Energy Laboratory, https://pvwatts.nrel.gov/, Apr. 8, 2020, 1 page.

Wikipedia, "Solar Irradiance", Wikipedia.org, https://en.wikipedia.org/wiki/Solar irradiance, Apr. 10, 2020, 18 pages.

"Solar power Calculator, Calculate your solar potential", https://solarcalculator.com.au/, Apr. 8, 2020, 10 pages.

Yano et al., "Prototype semi-transparent photovoltaic modules for greenhouse roof applications", http://dx.doi.org/10.1016/j.biosystemseng, Apr. 22, 2014, pp. 62-73.

Gobhinath et al., "A Prototype Development of MPPT Algorithm based Solar Photovoltaic Charging System", vol. 6, Apr. 2, 2016, pp. 139-143.

Liu et al., "High-Efficiency Isolated Photovoltaic Microinverter Using Wide-Band Gap Switches for Standalone and Grid-Tied Applications", doi:1033.90/en11030569, vol. 11, No. 569, 2018, 15 pages.

Murnane, Martin, "Isolation Technology Helps Integrate Solar Photovoltaic Systems onto the Smart Grid", Sep. 2012, 3 pages.

* cited by examiner

TECHNIQUES FOR FORECASTING SOLAR POWER GENERATION

CROSS-REFERENCE TO RELATED APPLICATIONS

This application is a continuation of U.S. Patent Application titled, "Techniques for Forecasting Solar Power Generation", filed Feb. 15, 2022, and having Ser. No. 17/672,450, which is a continuation of U.S. Patent Application titled "Techniques for Forecasting Solar Power Generation," filed on May 23, 2019, and having Ser. No. 16/421,326, now U.S. Pat. No. 11,264,948, which is a continuation-in-part of the co-pending U.S. Patent Application titled, "Techniques for Forecasting Solar Power Generation," filed on Apr. 24, 2019, and having Ser. No. 16/393,136, now U.S. Pat. No. 11,651,311, which claims the priority benefit of United States Provisional Patent Application titled, "Leveraging Data Collection Networks to Estimate Behind-the-Meter Solar Photovoltaic Generation," filed on Sep. 20, 2018, and having Ser. No. 62/734,189. The subject matter of these related applications is hereby incorporated herein by reference.

BACKGROUND

Field of the Various Embodiments

Embodiments of the present invention relate generally to wireless network communications and systems and, more specifically, to techniques for forecasting solar power generation.

DESCRIPTION OF THE RELATED ART

Electricity providers typically distribute electricity via an electricity distribution infrastructure to one or more downstream locations within a given area. For example, an electricity provider could distribute electricity via a power grid to various residences within a given county. Electricity providers usually monitor the distribution and/or consumption of electricity in real time in order to scale electricity production in response to varying levels of demand. For example, an electricity provider could remotely read electricity meter data associated with one or more downstream locations in order to estimate how much electricity needs to be generated to meet a current level of demand for electricity.

In the same vein, electricity providers oftentimes analyze historical electricity consumption data in an effort to make predictions regarding future demand for electricity. Based on these predictions, electricity providers can pre-emptively scale electricity production to meet anticipated demand, thereby improving the efficiency with which electricity is provided. For example, an electricity provider could identify one or more specific times of day when electricity consumption has historically exceeded normal levels. The electricity provider could then increase electricity production to prepare for the specific time(s) of day when increased electricity consumption is expected to occur.

With the introduction of various types of renewable energy, such as solar energy, the amount of electricity that is consumed within a given area can be offset, to a certain degree, by the amount of electricity that can be generated by solar power systems within that area. Accordingly, the amount of electricity that needs to be generated for the given area is equal to the demand for electricity less the amount of electricity that is generated via solar power systems. To accurately predict the amount of electricity that needs to be generated for the given area at any given time, the electricity provider needs to be able to predict the amount of electricity that is generated by solar power systems within the given area at any given time.

One problem that electricity providers encounter, though, is that predicting the amount of electricity that can be generated by the various solar power systems within a given area can be quite difficult. In particular, solar power systems generally have widely varying capabilities with respect to generating solar power. For example, one solar power system could have ten photovoltaic panels that are optimally oriented relative to the trajectory of the sun, while another solar power system could have one photovoltaic panel that is poorly oriented relative to the trajectory of the sun. These two solar power systems would generate vastly different amounts of electricity on most, if not all, days. Further, the amount of electricity generated by a given solar power system varies based on seasonal fluctuations in solar irradiance, weather conditions, and other environmental factors. For example, a given solar power system would typically generate greater amounts of electricity on clear summer days than on cloudy winter days.

As a general matter, electricity providers lack the ability to reliably determine the amount of electricity that can be generated by solar power systems within a given area and therefore cannot accurately predict how much electricity needs to be generated at any given time. Consequently, electricity providers can have difficulty scaling electricity production to meet anticipated needs, thereby reducing the efficiency with which electricity can be distributed to consumers.

As the foregoing illustrates, what is needed in the art are more effective ways to predict the amount of electricity generated by solar power systems within a given area.

SUMMARY

Various embodiments include a computer-implemented method, including processing a first data set received from a first measurement device to determine that a first insolation measurement generated by the first measurement device indicates a first insolation level associated with a first photovoltaic installation, processing a second data set received from a first prototype photovoltaic installation to determine that a first estimated solar power generation level corresponding to the first prototype photovoltaic installation indicates a first solar power generation level that is output by the first photovoltaic installation during exposure to solar energy having the first insolation level, and generating a solar power generation forecast for a geographical area based, at least in part, on the first insolation measurement and the first estimated solar power generation level.

At least one technological advantage of the disclosed techniques relative to the prior art is that solar power generation can be accurately predicted within a given geographical area, allowing electricity providers to scale electricity production to meet anticipated demand within the geographical area. As a result, electricity providers can supply electricity to consumers with greater efficiency. Another technological advantage of the disclosed techniques is that solar power generation can be approximated with reasonable accuracy independently of environmental factors such as cloud cover, allowing electricity providers to scale electricity production independently of seasonal changes, weather patterns, and so forth. Yet another technological advantage of the disclosed techniques is that the current level of cloud cover at a given location can be accurately estimated and used to improve the accuracy of solar power generation estimations that do not consider environmental factors, such as cloud cover. These technological advantages represent one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

Figure 1:
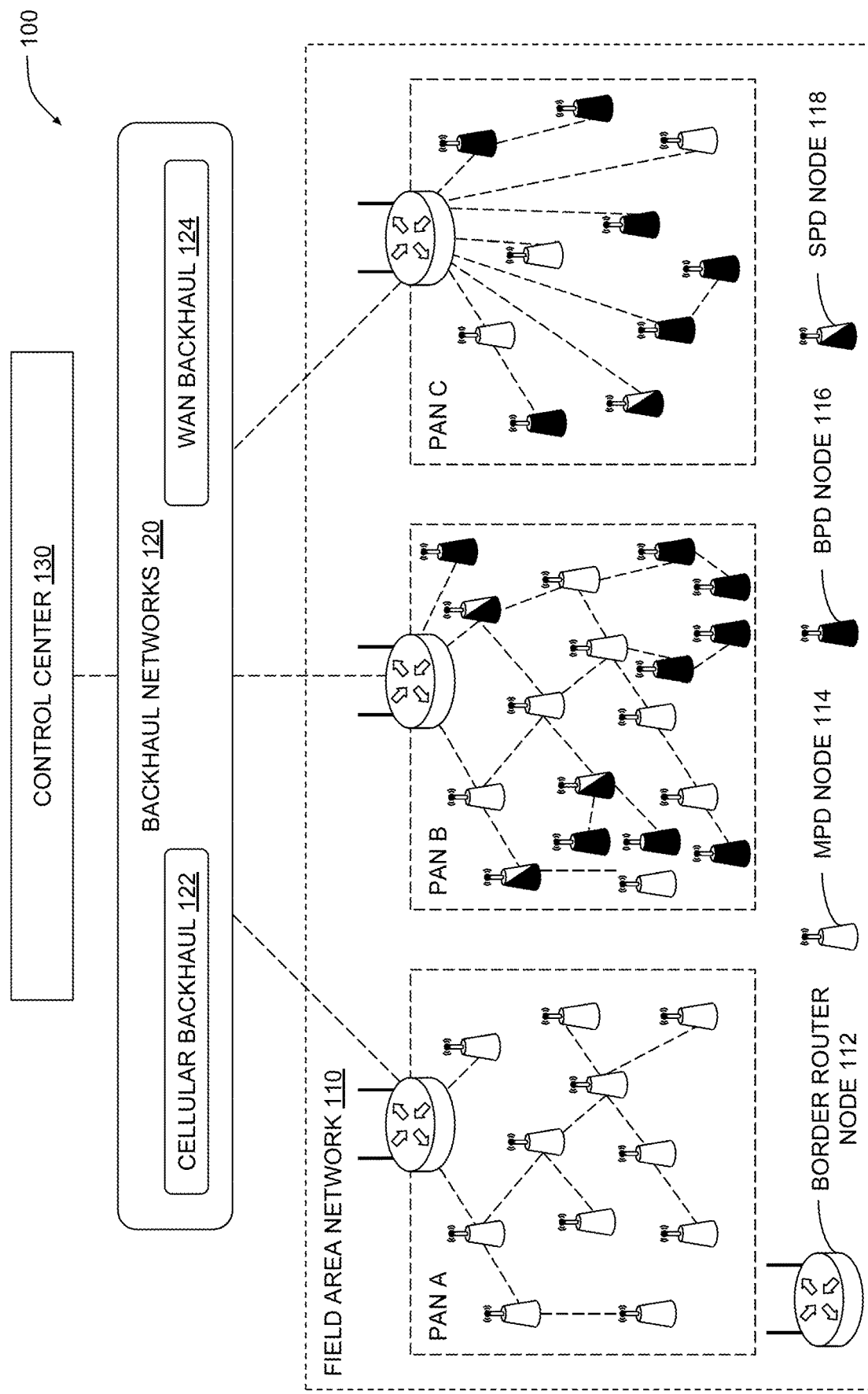
FIG. 1 illustrates a network system configured to implement one or more aspects of the various embodiments.

In the following description, numerous specific details are set forth to provide a more thorough understanding of the various embodiments. However, it will be apparent to one skilled in the art that the inventive concepts may be practiced without one or more of these specific details.

As noted above, electricity providers oftentimes make predictions regarding future demand for electricity in order to pre-emptively scale electricity production to meet anticipated demand. However, the amount of electricity that is actually needed within a given area at any given time is equal to the amount of electricity that is consumed within the given area at the given time less the amount of electricity that is generated by solar power systems within the given area at the given time. Accordingly, to accurately predict the demand for electricity within the given region, the electricity provider needs to predict the amount of electricity that can be generated by solar power systems within the given area at the given time.

Predicting the amount of electricity that can be generated by solar power systems within a given area can be quite difficult, though, for several reasons. First, different solar power systems can generate different amounts of electricity. Second, the amount of electricity generated by a given solar power system depends on various environmental factors. Consequently, electricity providers can have difficulty predicting the demand for electricity at any given time and may therefore have a limited ability to scale electricity production to meet anticipated demand.

To address these issues, various embodiments include a forecast engine that is configured to forecast solar power generation within a given geographical area. The forecast engine divides the geographical area into various solar regions having differing clear-sky insolation parameters. The forecast engine then assigns a specific solar region to each photovoltaic (PV) installation within the geographical region. The forecast engine also identifies a set of measurement device (MD) nodes within the geographical area that are capable of measuring solar insolation and assigns one or more MD nodes to each PV installation. For any given PV installation, the forecast engine determines a prototype PV installation that can be used to estimate clear-sky solar power generation output. The forecast engine generally performs the above operations offline in preparation for real-time forecasting operations.

Subsequently, to perform real-time forecasting operations, the forecast engine analyzes real-time measurement data output by the MD nodes representing current insolation levels at various locations within the geographical area. Based on this analysis, the forecast engine generates an MD index for each MD node that represents a current amount of cloud cover. The forecast engine scales the clear-sky solar power generation output of each PV installation based on the MD indices generated for the assigned MD nodes to generate an estimated PV installation solar power generation output corresponding to each location in the geographical area for a current point in time. Based on the estimated PV installation output for the current point in time, and based on various historical data and/or real-time data, the forecast engine generates a solar power generation forecast for the geographical area.

At least one technological advantage of the disclosed techniques relative to the prior art is that solar power generation can be accurately predicted within a given geographical area, allowing electricity providers to scale electricity production to meet anticipated demand within the geographical area. As a result, electricity providers can supply electricity to consumers with greater efficiency. Another technological advantage of the disclosed techniques is that solar power generation can be approximated with reasonable accuracy independently of environmental factors such as cloud cover, allowing electricity providers to scale electricity production independently of seasonal changes, weather patterns, and so forth. Yet another technological advantage of the disclosed techniques is that the current level of cloud cover at a given location can be accurately estimated and used to improve the accuracy of solar power generation estimations that do not consider environmental factors, such as cloud cover. These technological advantages represent one or more technological advancements over prior art approaches.

System Overview

FIG. 1 illustrates a network system configured to implement one or more aspects of the present embodiments. As shown, network system 100 includes a field area network (FAN) 110, backhaul networks 120, and a control center 130. FAN 110 is coupled to control center 130 via backhaul networks 120. Backhaul networks 120 include a cellular backhaul 122 that supports Internet protocol (IP) routing as well as a wide-area network (WAN) backhaul 124 that similarly support IP routing. Control center 130 is configured to coordinate the operation of FAN 110 via communications across cellular backhaul 122 and WAN backhaul 124.

FAN 110 includes personal area network (PANs) A, B, and C. PANs A and B are organized according to a mesh network topology, while PAN C is organized according to a star network topology. Each of PANs A, B, and C includes at least one border router node 112 and one or more mains-powered device (MPD) nodes 114. PANs B and C further include one or more battery-powered device (BPD) nodes 116 and one or more solar-powered device (SPD) nodes 118.

MPD nodes 114 draw power from an external power source, such as mains electricity or a power grid. MPD nodes 114 typically operate on a continuous basis without powering down for extended periods of time. BPD nodes 116 draw power from an internal power source, such as a battery. BPD nodes 116 typically operate intermittently and power down for extended periods of time in order to conserve battery power. SPD nodes 118 include solar panels that generate power from sunlight. SPD nodes 118 store generated power in secondary cells and draw power from those secondary cells to support node operations.

MPD nodes 114, BPD nodes 116, and SPD nodes 118 are coupled to, or included within, a utility distribution infrastructure (not shown) that distributes a resource to consumers. MPD nodes 114, BPD nodes 116, and SPD nodes 118 gather sensor data related to the distribution of the resource, process the sensor data, and communicate processing results and other information to control center 130. Border router nodes 112 operate as access points to provide MPD nodes 114, BPD nodes 116, and SPD nodes 118 with access to control center 130.

Any of border router nodes 112, MPD nodes 114, BPD nodes 116, and SPD nodes 118 are configured to communicate directly with one or more adjacent nodes via bi-directional communication links. The communication links may be wired or wireless links, although in practice, adjacent nodes of a given PAN exchange data with one another by transmitting data packets via wireless radio frequency (RF) communications. The various node types are configured to perform a technique known in the art as "channel hopping" in order to periodically receive data packets on varying channels. As known in the art, a "channel" may correspond to a particular range of frequencies. In one embodiment, a node may compute a current receive channel by evaluating a Jenkins hash function based on a total number of channels and the media access control (MAC) address of the node.

Each node within a given PAN may implement a discovery protocol to identify one or more adjacent nodes or "neighbors." A node that has identified an adjacent, neighboring node may establish a bi-directional communication link with the neighboring node. Each neighboring node may update a respective neighbor table to include information concerning the other node, including the MAC address of the other node as well as a received signal strength indication (RSSI) of the communication link established with that node.

Nodes may compute the channel hopping sequences of adjacent nodes to facilitate the successful transmission of data packets to those nodes. In embodiments where nodes implement the Jenkins hash function, a node computes a current receive channel of an adjacent node using the total number of channels, the MAC address of the adjacent node, and a time slot number assigned to a current time slot of the adjacent node.

Any of the nodes discussed above may operate as a source node, an intermediate node, or a destination node for the transmission of data packets. A given source node may generate a data packet and then transmit the data packet to a destination node via any number of intermediate nodes (in mesh network topologies). The data packet may indicate a destination for the packet and/or a particular sequence of intermediate nodes to traverse in order to reach the destination node. In one embodiment, each intermediate node may include a forwarding database indicating various network routes and cost metrics associated with each route.

In addition, any of the nodes discussed above can be configured to operate as access points for other nodes included in FAN 110. For example, one or more MPD nodes 114 and one or more SPD nodes 118 could be configured as access points for different or overlapping portions of FAN 110. Further, those MPD node(s) 114 and SPD node(s) 118 could be configured to coordinate load balancing of network traffic across different backhaul networks 120.

Nodes may transmit data packets across a given PAN and across one or more backhaul networks 120 to control center 130. Similarly, control center 130 may transmit data packets across one or more backhaul networks 120 and across any given PAN to a particular node included therein. As a general matter, numerous routes may exist which traverse any of PANs A, B, and C and include any number of intermediate nodes, thereby allowing any given node or other component within network system 100 to communicate with any other node or component included therein.

Control center 130 includes one or more server machines configured to operate as sources for, or destinations of, data packets that traverse within network system 100. The server machines may query nodes within network system 100 to obtain various data, including raw or processed sensor data, power consumption data, node/network throughput data, status information, and so forth. The server machines may also transmit commands and/or program instructions to any node within network system 100 to cause those nodes to perform various operations. In one embodiment, each server machine is a computing device configured to execute, via a processor, a software application stored in a memory to perform various network management operations, as described in greater detail below in conjunction with FIG. 4.

Nodes may likewise include computing device hardware configured to perform processing operations and execute program code. Each node may further include various analog-to-digital and digital-to-analog converters, digital signal processors (DSPs), harmonic oscillators, transceivers, and any other components generally associated with RF-based communication hardware, as described in greater detail below in conjunction with FIG. 3.

Figure 2:
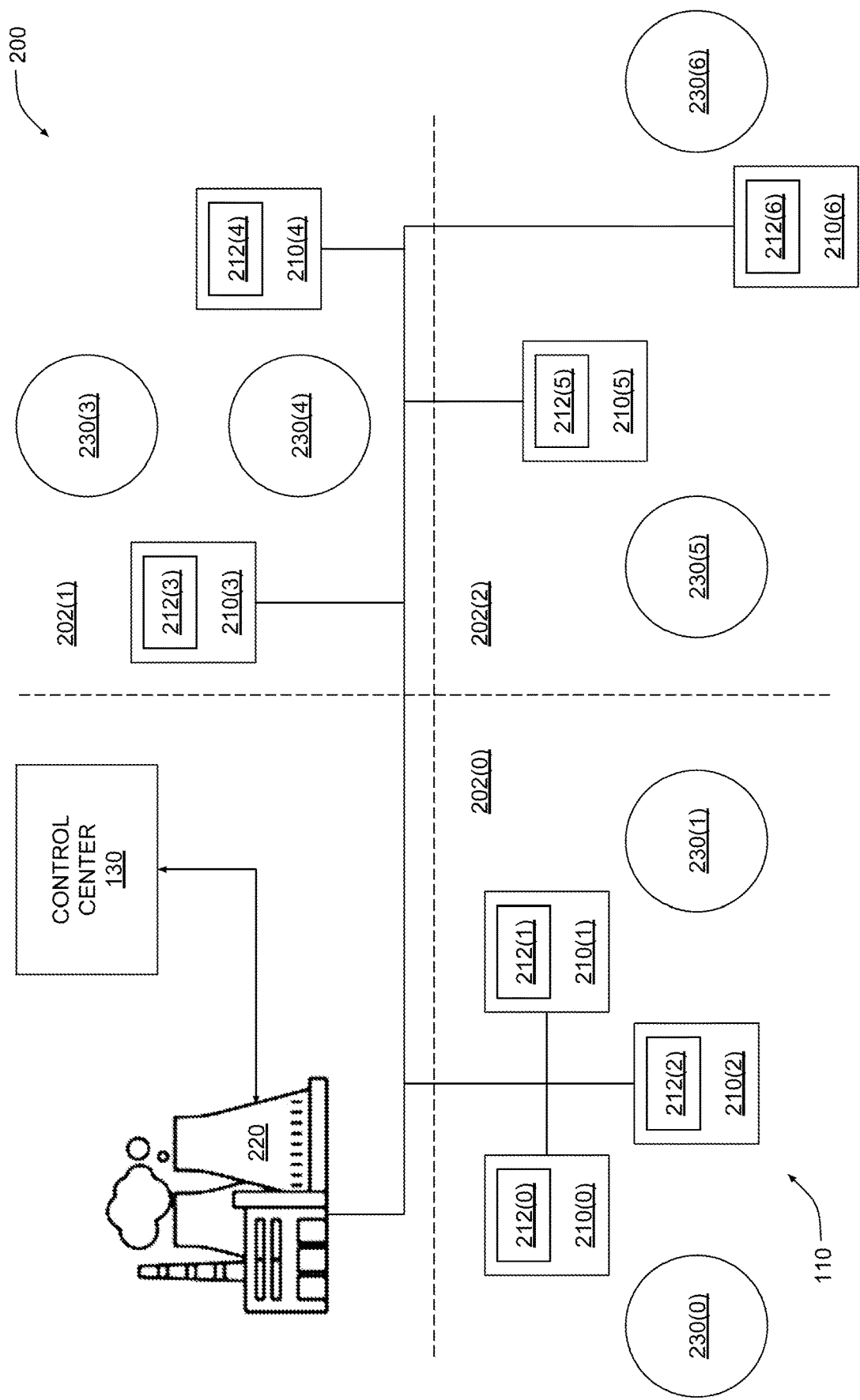
FIG. 2 illustrates a geographical area where the network system of FIG. 1 can be deployed, according to various embodiments.

Any of border router nodes 112, MPD nodes 114, BPD nodes 116, and SPD nodes 118 can be configured as an MD node that is configured to measure the current level of insolation at a particular location and report the current level of insolation, periodically and/or in real time, to control center 130. As referred to herein, the term "Insolation" refers to the amount of solar radiation that reaches a given location. FIG. 2 illustrates a set of MD nodes deployed across a geographical area in conjunction with FAN 110 of FIG. 1.

FIG. 2 illustrates a geographical area where the FAN of FIG. 1 can be deployed, according to various embodiments. As shown, geographical area 200 is divided into different solar regions 202 that include various premises 210 configured with different PV installations 212. A given premise 210 could be, for example, a residence where one or more solar panels are installed, a commercial building that is configured with a solar power system, a parking lot that includes a solar panel canopy, and so forth. Each premise 210 is coupled to an electricity provider 220 that supplies electricity to the different premises 210 via an electricity distribution infrastructure. Electricity provider 220 is coupled to control center 130 of FIG. 1.

As mentioned above in conjunction with FIG. 1, any of border router nodes 112, MPD nodes 114, BPD nodes 116, and SPD nodes 118 of FIG. 1 can be configured as a measurement device that measures the current level of insolation at a particular location. As is shown, various nodes that are configured as MD nodes 230 are deployed within geographical area 200 in conjunction with FAN 110. MD nodes 230 are coupled to control center 130 via wired or wireless connections. Each MD node 230 can communicate with control center 130 directly or via one or more intermediate nodes that may or may not be configured as MD nodes 230.

Control center 130 is configured to obtain measurement data from MD nodes 230 indicating the current levels of insolation at the locations where MD nodes 230 are deployed. Based on this measurement data and various other data, control center 130 generates forecast data. The forecast data indicates a predicted amount of electricity generated by PV installations 212 within geographical area 200 over some future interval. Based on the forecast data, electricity provider 220 can scale electricity production up or down in order to meet anticipated demand for electricity.

For example, if control center 130 forecasts an increase in solar power generation over a subsequent fifteen-minute interval, then electricity provider 220 could scale down electricity production during that fifteen-minute interval. In this situation, electricity provider 220 could scale electricity production down because the increase in solar power generation would at least partially offset the current demand for electricity. Similarly, if control center 130 forecasts a decrease in solar power generation over a subsequent fifteen-minute interval, then electricity provider 220 could scale electricity production up during that fifteen-minute interval. In this situation, electricity provider 220 would scale electricity production up in order to compensate for the predicted decrease in solar power generation.

Hardware Overview

Figure 3:
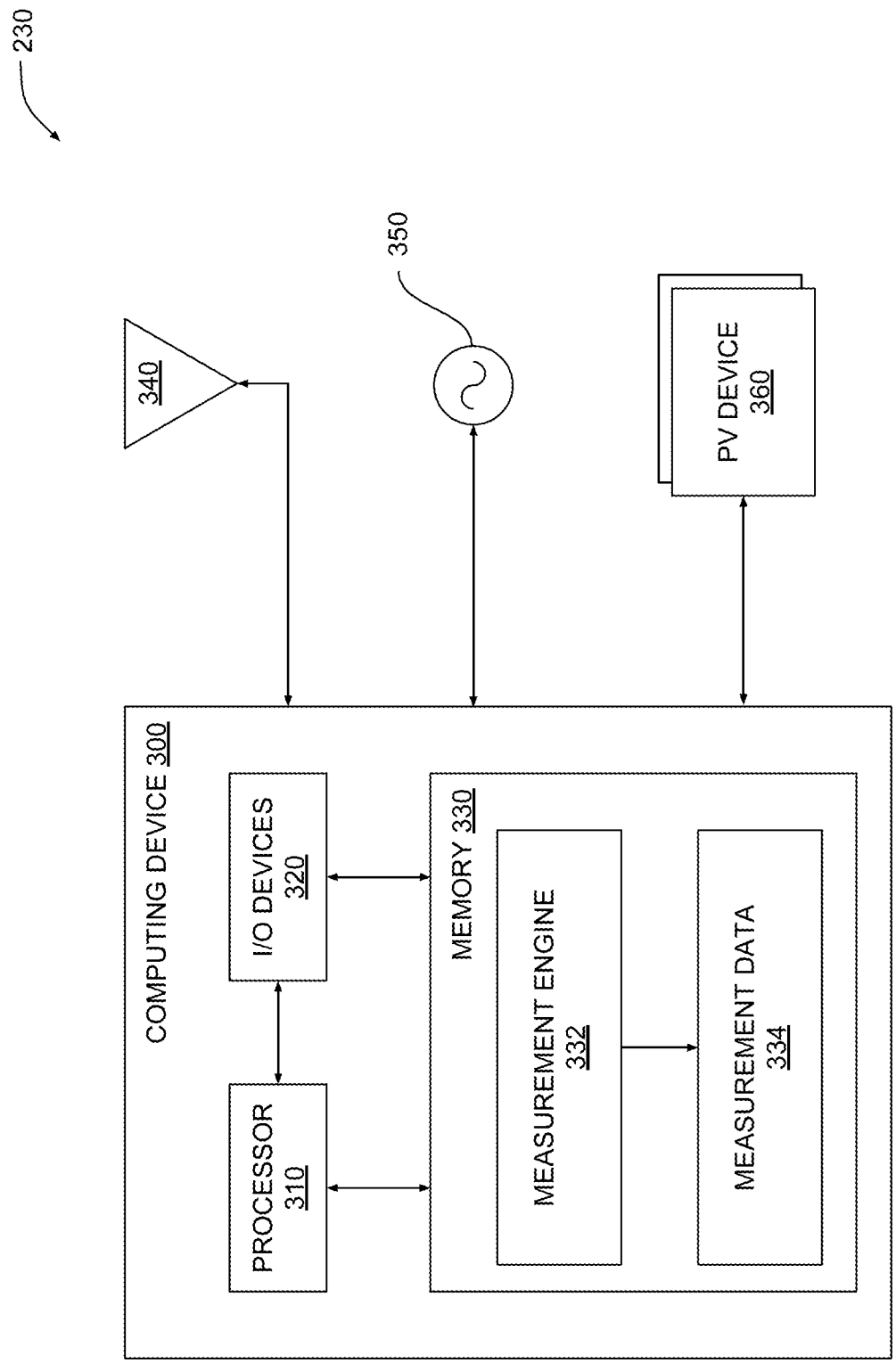
FIG. 3 is a more detailed illustration of one of the measurement device nodes of FIG. 2, according to various embodiments.

FIG. 3 is a more detailed illustration of one of the MD nodes of FIG. 2, according to various embodiments. As shown, an MD node 230 includes a computing device 300 coupled to a transceiver 340, an oscillator 350, and a PV device 360. Computing device 300 coordinates the operations of MD node 230. Transceiver 340 is configured to transmit and receive data packets across network system 100 using a range of channels and power levels. Oscillator 350 provides one or more oscillation signals according to which the transmission and reception of data packets can be scheduled. PV device 360 generates real-time measurements indicating the current insolation level at the location where MD node 230 is deployed.

Computing device 300 includes a processor 310, input/output (I/O) devices 320, and memory 330, coupled together. Processor 310 may include any hardware configured to process data and execute software applications. Processor 310 may include a real-time clock (RTC) (not shown) according to which processor 310 maintains an estimate of the current time. I/O devices 320 include devices configured to receive input, devices configured to provide output, and devices configured to both receive input and provide output. Memory 330 may be implemented with any technically feasible storage medium.

Memory 330 includes a measurement engine 332 and measurement data 334. Measurement engine 332 includes program code that, when executed by processor 212, interacts with PV device 360 to generate measurement data 334 representing the current insolation level at the location where MD node 230 is deployed. Measurement engine 332 also transmits measurement data 334 to control center 130 in real time and/or at periodic intervals. Control center 130 is described in greater detail below in conjunction with FIG. 4.

Figure 4:
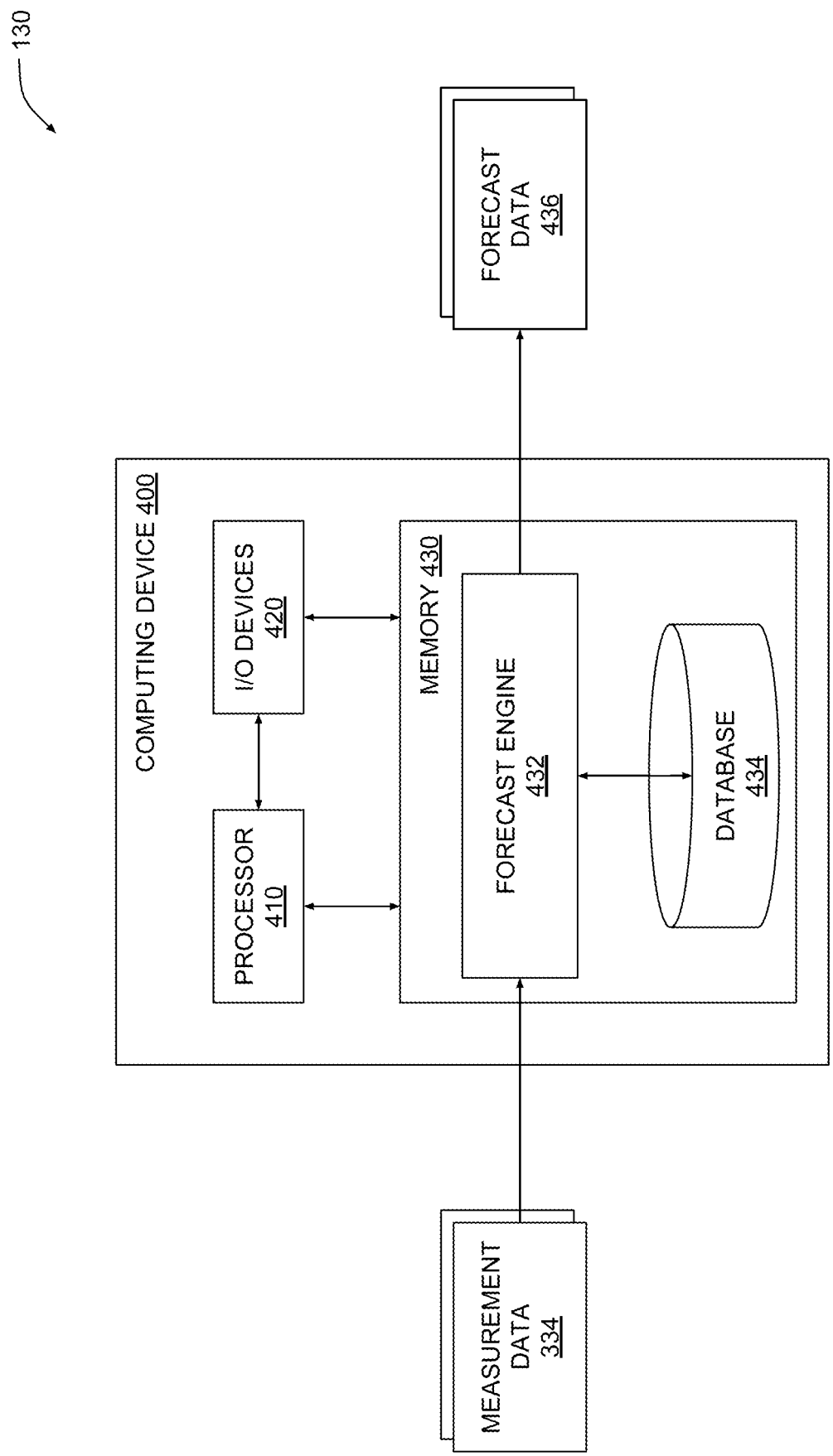
FIG. 4 is a more detailed illustration of the control center of FIG. 2, according to various embodiments.

FIG. 4 is a more detailed illustration of the control center of FIG. 2, according to various embodiments. As shown, control center 130 includes one or more computing devices 400. Each computing device 400 may, in some embodiments, be configured as a server computing device within a datacenter associated with control center 130. The one or more computing devices 400 generally coordinate the operations of FAN 110, and, specifically, interact with MD nodes 230 in order to generate forecast data, as discussed above in conjunction with FIG. 2.

Computing device 400 includes a processor 410, input/output (I/O) devices 420, and memory 430, coupled together. Processor 410 may include any hardware configured to process data and execute software applications. I/O devices 420 include devices configured to receive input, devices configured to provide output, and devices configured to both receive input and provide output. Memory 430 may be implemented by any technically feasible storage medium.

Memory 430 includes a forecast engine 432 and a database 434, coupled together. Forecast engine 432 includes program code that, when executed by processor 410, processes measurement data 334 received from MD nodes 230 in conjunction with various other data stored in database 434 to generate forecast data 436. Forecast data 436 represents a real-time prediction of solar power generation within geographical area 200 over a future interval. In order to generate forecast data 436, forecast engine 432 executes nine separate processes that are described in greater detail below in conjunction with FIG. 5.

Forecast Engine Software Description

Figure 5:
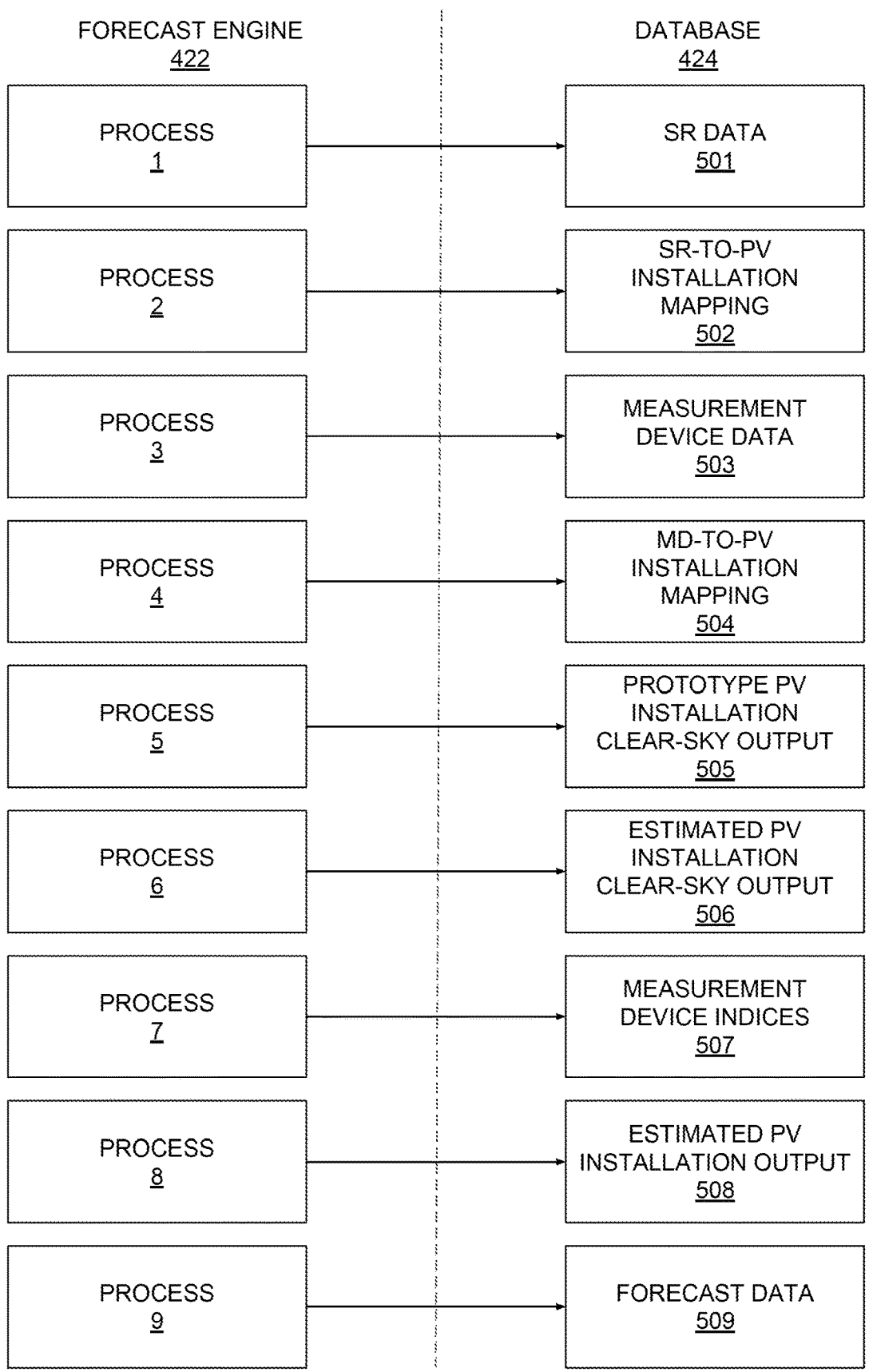
FIG. 5 is a more detailed illustration of the forecast engine of FIG. 4, according to various embodiments.

FIG. 5 is a more detailed illustration of the forecast engine of FIG. 4, according to various embodiments. As shown, forecast engine 432 includes processes 1, 2, 3, 4, 5, 6, 7, 8 and 9. Forecast engine 432 executes processes 1-9 in order to forecast solar power generation within geographical region 200 in the manner previously described. In one embodiment, forecast engine 432 may execute processes 1-6 offline before solar power generation forecasting is to occur. Subsequently, forecast engine 432 may execute processes 7-9 in real time in order to perform real-time solar power generation forecasting. Forecast engine 432 executes processes 1-9 based on various data that is described in greater detail below. When executing processes 1-9, forecast engine 432 generates and stores various data in database 434, as described in greater detail herein.

When executing process 1, forecast engine 432 divides geographical area 200 into the different solar regions 202 discussed above in conjunction with FIG. 2 to generate solar region data (SR data) 501. SR data 501 indicates one or more different types of boundaries that define regions with similar insolation characteristics. Forecast engine 432 can generate SR data 501 based on physical connectivity between premises 210 and various elements of the electricity distribution infrastructure, including substations, transformers, and so forth. Alternatively, forecast engine 432 can generate SR data 501 based on geospatial boundaries, including zip codes, city/county boundaries, and so forth. Forecast engine 432 can also generate SR data 501 based on climate zones associated geographical area 200. SR data 501 includes latitude and longitude data for the centroid of each solar region defined in SR data 501, as well as clear-sky insolation values for each such centroid.

When executing process 2, forecast engine 432 assigns a different solar region to each PV installation 212 within geographical area 200 to generate SR-to-PV installation mapping 502. SR-to-PV installation mapping 502 indicates, for each PV installation 212 and corresponding premise 210, a specific solar region set forth in SR data 501. SR-to-PV installation mapping 502 also indicates configuration parameters associated with each premise 210 and corresponding PV installation 212, including location data, system information, operating characteristics, and so forth.

When executing process 3, forecast engine 432 collects data associated with each MD node 230 to generate MD data 503. MD data 503 indicates, for any given MD node 230, a node type, node location, PV panel position and/or orientation, data output parameters, and other node-specific data. Based on location data included in MD data 503, forecast engine 432 assigns a solar region to each MD node 230 and then updates MD data 503 to indicate, for each MD node 230, the assigned solar region.

When executing process 4, forecast engine 432 maps one or more MD nodes 230 to each different PV installation 212 to generate MD-to-PV installation mapping 504. For a given PV installation 212, forecast engine 432 analyzes some or all MD nodes 230 and identifies one or more of those MD nodes 230 that can accurately measure the insolation level at the given PV installation 212. In doing so, forecast engine 432 determines the distance between each MD node 230 and the given PV installation 212, the bearing of PV panels associated with each MD node 230 relative to PV panels in the given PV installation 212, and a quality of measurement for each MD node 230. Forecast engine 432 then computes a weighted sum of the resultant data to generate a score for each MD node 230. Forecast engine 432 maps the one or more MD nodes 230 having the highest scores to the PV installation 212. By performing the above operations across some or all PV installation 212, forecast engine 432 generates MD-to-PV installation mapping 504. Process 4 is described in greater detail below in conjunction with FIGS. 7-8.

When executing process 5, forecast engine 432 estimates the output of a set of prototype PV installations under clear-sky conditions to generate prototype PV installation clear-sky output 505. Forecast engine 432 analyzes data associated with a given PV installation 212 and identifies, within a library of prototype PV installations, a specific prototype PV installation with system characteristics that are similar to the given PV installation 212. Forecast engine 432 then determines the estimated power generation output of the prototype PV installation within the solar region assigned to the given PV installation 212 under clear-sky conditions. In doing so, forecast engine 432 could, for example, evaluate a parametric model of a prototype PV installation to estimate solar power generation for the prototype PV installation. In one embodiment, forecast engine 432 may execute process 5 to generate output estimates for each combination of prototype PV installation and solar region. Process 5 is described in greater detail below in conjunction with FIGS. 9-10.

When executing process 6, forecast engine 432 estimates the output of each PV installation 212 under clear-sky conditions to generate estimated PV installation clear-sky output 506. Forecast engine 432 analyzes the prototype PV installation clear-sky output for a given PV installation 212 and scales that estimated output based on one or more configuration parameters associated with the given PV installation 212. For example, if the given PV installation 212 includes N solar panels, and the corresponding prototype PV installation is defined for 1 panel, then forecast engine 432 could multiple the output of the prototype PV installation by N to arrive at an estimated output for the PV installation 212. Forecast engine 432 performs these operations across some or all PV installations to generate estimated PV installation clear-sky output 506. Process 6 is described in greater detail below in conjunction with FIGS. 9-10.

When executing process 7, forecast engine 432 processes measurement data 334 provided by MD nodes 230 to generate MD indices 507. Each MD index 507 indicates the current level of cloud cover at the location where a corresponding MD node 230 resides. To generate a given MD index 507 for a corresponding MD node 230 at a specific date and time, forecast engine 432 computes the maximum expected output of the corresponding MD node 230 at the specific date and time. Forecast engine 432 then scales the measurement data 334 associated with the corresponding MD node 230 relative to that maximum expected output to produce the given MD index, which is a value between zero and one. Forecast engine 432 can determine the maximum expected output of the given MD node 230 at the specific date and time based on historical measurement data and/or clear-sky insolation estimates corresponding to the location where the given MD node 230 resides. Process 7 is described in greater detail below in conjunction with FIGS. 11-12.

When executing process 8, forecast engine computes the estimate solar power generation for each PV installation 212 to generate estimated PV installation output 508. To generate the estimated PV installation output 508 for a given PV installation 212, forecast engine 432 first identifies the MD node 230 corresponding to the given PV installation 212 based on MD-to-PV installation mapping 504 generated via process 4. Forecast engine 432 then determines, based on MD indices 507, the particular MD index associated with that MD node 230. Finally, forecast engine 432 multiplies the estimated PV installation clear-sky output 506 associated with the given PV installation 212 by the MD index. In this fashion, forecast engine 432 scales the estimated PV installation clear-sky output relative to an estimate of the current level of cloud cover. The resultant estimated PV installation output 508 represents the total amount of electricity that is produced within geographical area 200 at the current time.

When executing process 9, forecast engine 432 processes the estimated PV installation output 508 that is generated via process 8 and then applies a predictive model to extrapolate this data over some future interval to generate forecast data 509. Forecast data 509 indicates the predicted solar power generation across geographical area 200. Forecast engine 432 can implement Machine Learning to generate the predictive model. In particular, forecast engine 432 can analyze historical PV installation output and/or historical MD indices in conjunction with historical weather data. Based on this analysis, forecast engine 432 modifies various parameters of the predictive model to describe how PV installation output and/or MD indices change in response to changing weather conditions. Based on forecast data 509, electricity provider 220 advantageously can scale electricity production in proportion to expected changes in solar power generation, thereby increasing the efficiency with which electricity can be supplied to consumers.

Figure 6:
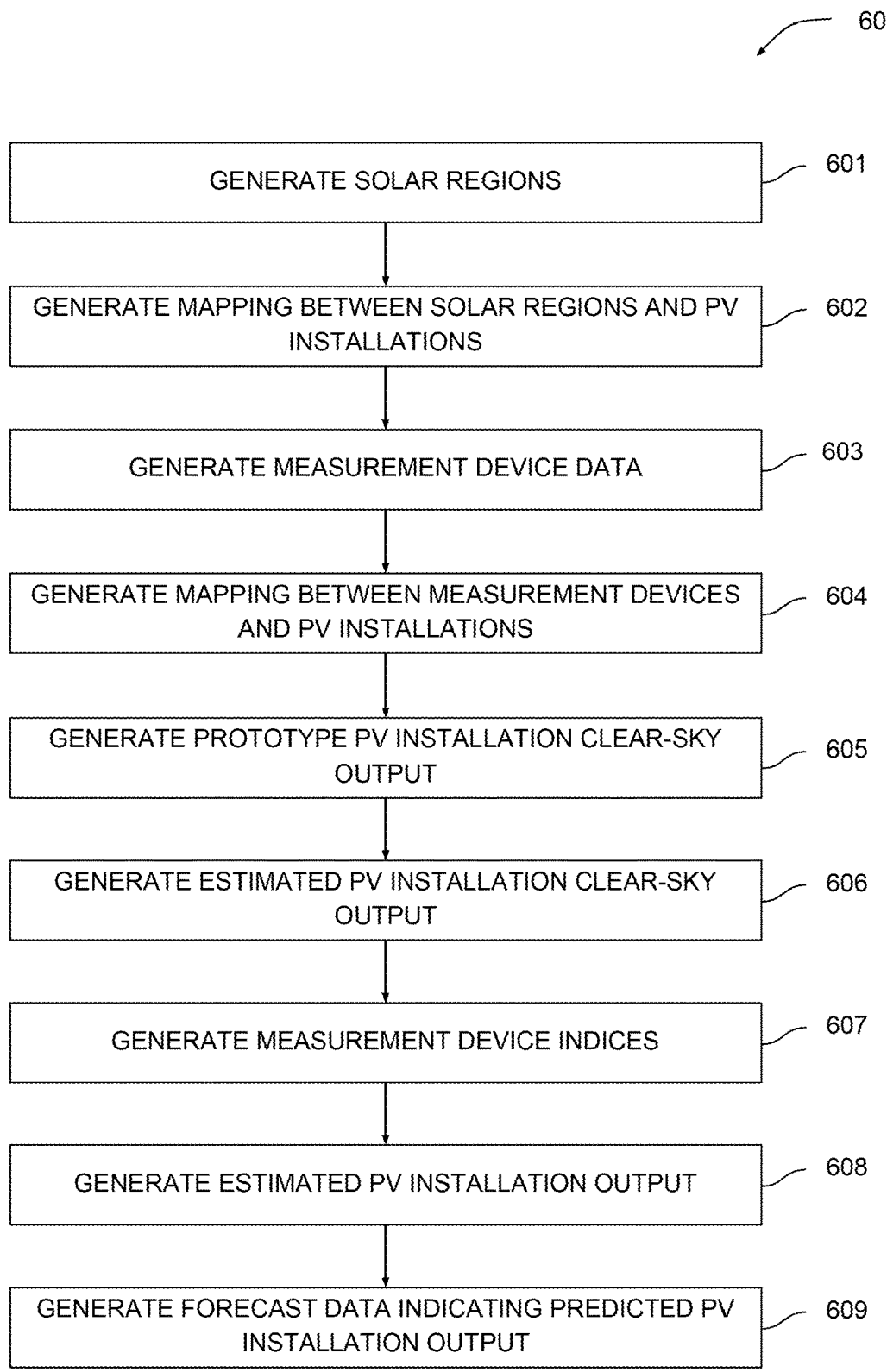
FIG. 6 is a flow diagram of method steps for forecasting solar power generation within a geographical area, according to various embodiments.

FIG. 6 is a flow diagram of method steps for forecasting solar power generation within a geographical area that is serviced by a utility provider, according to various embodiments. Although the method steps are described in conjunction with the systems of FIGS. 1-5, persons skilled in the art will understand that any system configured to perform the method steps in any order falls within the scope of the present embodiments.

As shown, a method 600 begins at step 601, where forecast engine 432 of FIG. 4 generates a set of solar regions 202. Each solar region 202 defines a portion of geographical area 200 having similar insolation parameters. Forecast engine 432 can generate a given solar region based on power grid connectivity, geospatial boundaries, and/or climate zones. Forecast engine 432 performs step 601 when executing process 1 of FIG. 5.

At step 602, forecast engine 432 generates a mapping between solar regions and solar installations. In particular, forecast engine 432 assigns a specific solar region to each different PV installation 212. Forecast engine 432 generally assigns a given solar region to a given PV installation 212 based on the location of the given PV installation 212. Forecast engine 432 performs step 602 when executing process 2 of FIG. 5.

At step 603, forecast engine 432 generates measurement device data. The measurement device data generated via step 603 indicates various installation parameters associated with MD nodes 230 as well as a specific assignment of solar region that is generated by forecast engine 432 based measurement device location. Forecast engine 432 performs step 603 when executing process 3 of FIG. 5.

At step 604, forecast engine 432 generates a mapping between MD nodes and PV installations. In particular, forecast engine 432 determines one or more MD nodes 230 that reside proximate to any given PV installation 212, have similar installation parameters as the given PV installation 212, and provide measurement data with at least a minimum level of quality and associates the given PV installation 212 with the one or more MD nodes 230. Forecast engine 432 performs step 604 when executing process 4 of FIG. 5.

At step 605, forecast engine 432 generates a prototype PV installation clear-sky output for each PV installation. Forecast engine maps each PV installation 212 to a particular prototype PV installation within a library of prototype PV installations. The prototype PV installation for a given PV installation 212 generally has similar system, installation, and/or operational parameters as the given PV installation 212. Forecast engine 432 then estimates the electrical output of each prototype solar PV installation. Specifically, for a given prototype PV installation associated with a given PV installation 212, forecast engine 432 applies a theoretical model of insolation to compute the insolation level at the PV installation 212 and/or within the solar region where the PV installation 212 resides. Forecast engine 432 then applies a theoretical model of solar power generation to compute the output the prototype PV installation based on the computed insolation level. Forecast engine 432 performs step 605 when executing process 5 of FIG. 5.

At step 606, forecast engine 432 generates an estimated PV installation clear-sky output based on the corresponding PV installation clear-sky output generated at step 605. Forecast engine 432 scales the prototype PV installation clear-sky output generated at step 606 based on various system and/or environmental factors associated with each corresponding PV installation 212. Forecast engine 432 performs step 606 when executing process 6 of FIG. 5.

At step 607, forecast engine 432 generates measurement device indices for the various MD nodes analyzed at step 603. A given MD index corresponding to a particular MD node 230 at a particular date and time represents the current level of cloud cover at the particular MD node 230 at the particular date and time. Each MD index is a value between zero and one and is computed by forecast engine 432 based on real-time measurement data 334 and based on an expected maximum output for each MD node 230. Forecast engine 432 performs step 607 when executing process 7 of FIG. 5.

At step 608, forecast engine 432 generates an estimated PV installation output for each PV installation within the geographical area. Forecast engine 432 modifies the estimated PV installation clear-sky output generated via step 606 to correct for the potential presence of cloud cover. In so doing, forecast engine 432 scales each estimated PV installation clear-sky output relative to an MD index associated with a corresponding PV installation. Forecast engine 432 performs step 608 when executing process 8 of FIG. 5.

At step 609, forecast engine 432 generates forecast data indicating predicted PV installation output. Forecast engine 432 implements a predictive model that can be generated by processing historical PV installation output and/or historical MD indices in conjunction with corresponding weather data. Then, forecast engine 432 can apply Machine Learning techniques to model how PV installation output and/or historical MD indices change in response to weather. Forecast engine 432 performs step 609 when executing process 9 of FIG. 5.

Mapping MD Nodes to PV Installations

Figure 7:
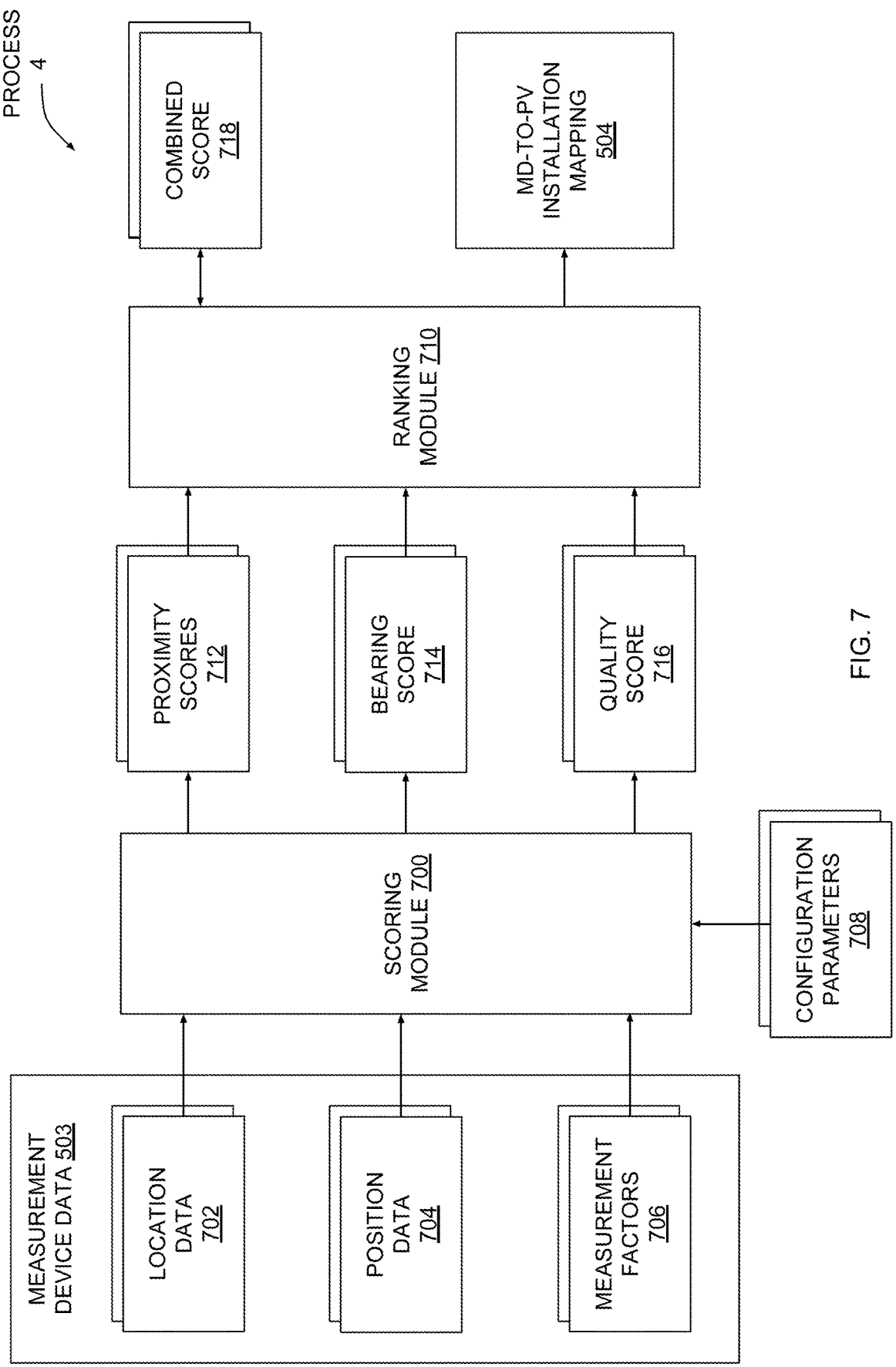
FIG. 7 is a more detailed illustration of process 4 of FIG. 5, according to various embodiments.

FIG. 7 is a more detailed illustration of process 4 of FIG. 5, according to various embodiments. As discussed above in conjunction with FIG. 5, via process 4, forecast engine 432 assigns one or more MD nodes 230 to each PV installation 212. The MD node(s) 230 assigned to a given PV installation 212 generate(s) measurement data 334 that can be used to estimate the amount of cloud cover at the location where the given PV installation 212 resides. Estimating the amount of cloud cover in this manner allows forecast engine 432 to modify clear-sky solar power generation calculations to compensate for decreased insolation resulting from cloud cover interference, thereby leading to more accurate solar power generation forecasts set forth in forecast data 509. Accordingly, process 4 is an important step towards generating accurate solar power generation forecasts.

As shown, process 4 includes a scoring module 700 and a ranking module 710 that interoperate to generate MD-to-PV installation mapping 504 of FIG. 5. In operation, scoring module 700 obtains location data 702, position data 704, and measurement factors 706 from measurement device data 503 of FIG. 5. Scoring module 700 also obtains configuration parameters 708 associated with PV installations 212. Configuration parameters 708 could be included in, for example, SR-to-PV installation mapping 502 of FIG. 5. Scoring module 200 then generates proximity scores 712, bearing scores 714, and quality scores 716. Scoring module 700 generates, for a given PV installation 212, a different set of scores for each different MD node 230 that can be mapped to the given PV installation 212. The set of scores associated with any particular pairing of MD node 230 and PV installation 212 represents the suitability of assigning that MD node 230 to that PV installation 212 for the purpose of estimating cloud cover at the location of that PV installation 212.

Location data 702 indicates the location of each MD node 230. For example, location data 702 could include the latitude and longitude of each MD node 230. Similarly, configuration parameters 708 indicate the location of each PV installation 212. To compute the proximity score 712 for a given MD node 230 relative to a given PV installation 212, scoring engine 200 first computes the great circle distance between the location of the given MD node 230 and the location of the given PV installation 212. Scoring engine 200 then evaluates an exponentially-decaying function based on the computed distance to generate proximity score 712. In this manner, scoring engine 200 awards a higher proximity score to an MD node 230 that resides closer to the given PV installation 212.

Position data 704 includes data that describes how the PV devices 360 associated with each MD node 230 are positioned. For example, position data 704 could indicate the tilt angle of a light sensor coupled to an MD node 230. To compute bearing score 714 for a given MD node 230 relative to a given PV installation 212, scoring engine 200 first computes the bearing of the PV device 360 associated with the given MD node 230 relative to the location of the given PV installation 212. Scoring engine 200 then adjusts the computed bearing to account for the azimuth of the PV panels associated with the given PV installation 212, thereby generating a bearing offset value. Finally, scoring engine 200 normalizes the bearing offset to generate bearing sore 714. The normalization process favors MD nodes 230 with PV devices 360 that are aligned with the PV panels of the given PV installation 212.

Measurement factors 706 indicate various factors associated with each MD node 230 that can affect the quality of measurement data 334 captured by those nodes in estimating the current insolation level. For example, measurement factors 706 could include, for a given MD node 230, a ranking of the type of measurement produced by the given MD node 230, a percentage of shading associated with the location where the given MD node 230 resides, and a maintenance frequency associated with the given MD node 230. Scoring engine 700 combines these factors together to generate quality score 716. For example, scoring engine 700 could multiply together various values associated with each factor.

Ranking module 710 obtains proximity scores 712, bearing scores 714, and quality scores 716 from scoring module 700 and then generates a combined score 718 for each MD node 230 relative to each different PV installation 212. To generate the combined score 718 for a given MD node 230 relative to a given PV installation 212, ranking module 710 computes a weighted average of the proximity score 712, the bearing score 714, and the quality score 716 generated for the given MD node 230 relative to the given PV installation 212.

For any given PV installation 212, ranking module 710 then ranks some or all MD nodes 230 based on the combined scores 718 generated for those MD nodes 230 relative to the given PV installation 212. Ranking module 710 then selects one or more of the most highly-ranked MD nodes 230 and maps these nodes to the given PV installation 212. Ranking module 710 stores the mapping between highly-ranked MD nodes 230 and PV installations 212 in MD-to-PV installation mapping 504.

Via the above techniques, forecast engine 432 maps MD nodes 230 to PV installations 212 in a manner than accounts for MD node 230 proximity, PV device 360 position and/or orientation, and MD device 230 data output quality. A given MD node 230 that is mapped to a given PV installation 212 with the disclosed approach may thus provide measurement data 334 that can be used to accurately estimate the amount of cloud cover at the given PV installation 212. Accordingly, MD-to-PV installation mapping 504 can be used to produce more accurate solar power generation forecasts set forth in forecast data 509. The techniques described above in conjunction with FIG. 7 are also described in greater detail below in conjunction with FIG. 8.

Figure 8:
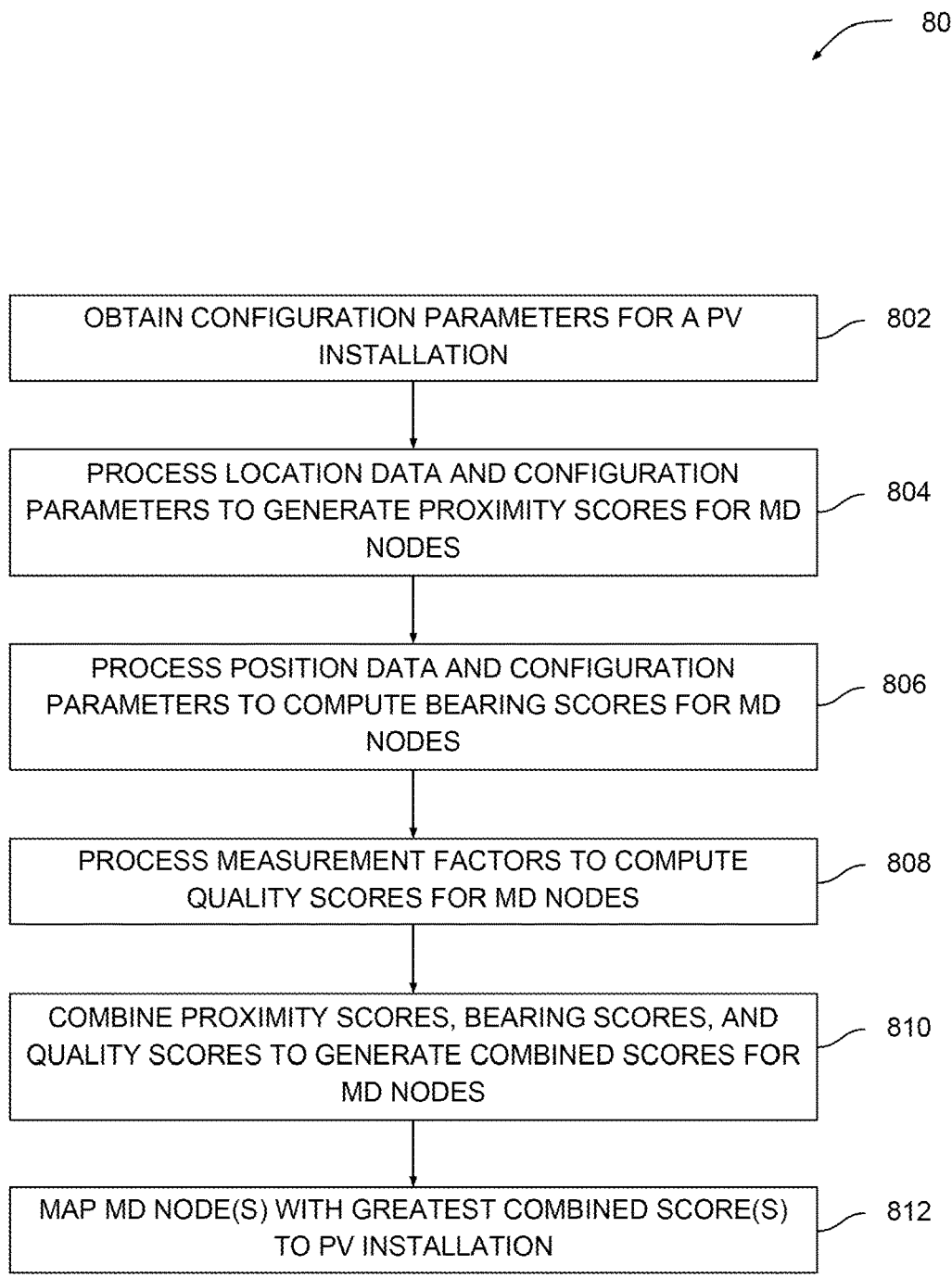
FIG. 8 is a flow diagram of method steps for mapping measurement device nodes to photovoltaic installations, according to various embodiments.

FIG. 8 is a flow diagram of method steps for mapping measurement device nodes to photovoltaic installations, according to various embodiments. Although the method steps are described in conjunction with the systems of FIGS. 1-7, persons skilled in the art will understand that any system configured to perform the method steps in any order falls within the scope of the present embodiments.

As shown, a method 800 begins at step 802, where forecast engine 432 of FIG. 5 obtains configuration parameters for a PV installation 212. The configuration parameters include the location of the PV installation 212. For example, configuration parameters 708 of FIG. 7 could include latitude and longitude values for the PV installation 212 or global positioning system (GPS) coordinates for the PV installation 212, among other location data.

At step 804, forecast engine 432 processes location data associated with some or all MD nodes 230 along with the configuration parameters obtained at step 802 to generate a proximity score for each MD node relative to the PV installation 212. Forecast engine 432 may generate a separate proximity score for each MD node 230 relative to each different PV installation. The proximity score generated for a given MD node 230 relative to a given PV installation 212 is an exponentially-decaying function of the great circle distance between the given MD node 230 and the given PV installation 212.

At step 806, forecast engine 432 processes position data associated with some or all MD nodes 230 along with the configuration parameters obtained at step 802 to compute a bearing score for each MD node relative to the PV installation 212. Forecast engine 432 may generate a separate bearing score for each MD node 230 relative to each different PV installation. The bearing score generated for a given MD node 230 relative to a given PV installation 212 is a function of the difference between a bearing value computed for a PV device 360 associated with the given MD node 230 and an azimuth angle corresponding to a PV panel associated with the given PV installation 212.

At step 808, forecast engine 432 processes measurement factors associated with some or all MD nodes 230 to compute a quality score for each of those MD nodes 230. The quality score generated for a given MD node 230 accounts for the type of data generated by the given MD node 230, a percentage of shading associated with the location where the MD node 230 resides, and a maintenance frequency associated with the MD node 230.

At step 810, forecast engine 432 combines, for a given MD node 230, the proximity score computed at step 804, the bearing score computed at step 806, and the quality score computed at step 808 to generate a combined score for the given MD node 230 relative to the PV installation 212. In doing so, forecast engine 432 may compute a weighted average of the proximity score, the bearing score, and the quality score. The combined score for a given MD node 230 relative to the PV installation 212 generally represents the suitability of the given MD node 230 in estimating the current level of cloud cover at the PV installation 212.

At step 812, forecast engine 432 maps the MD node(s) 230 with the greatest combined score(s) to the PV installation 212. In doing so, forecast engine 432 ranks the MD nodes 230 based on the combined scores generated relative to the PV installation 212 and then selects one or more of the most highly-ranked MD nodes 230. Forecast engine 432 maps the highly-ranked MPD node(s) 230 to the PV installation 212 and updates MD-to-PV installation mapping 504 to reflect this mapping.

Forecast engine 432 executes process 4 described above in conjunction with FIGS. 5-7 to perform the method 800. As described, forecast engine 432 performs the above techniques to generate a mapping between PV installations 212 and the MD node(s) 230 that can effectively estimate cloud cover for those PV installations 212. These techniques improve the accuracy with which forecast engine 432 can produce solar power generation forecasts set forth in forecast data 509.

Estimating Solar Power Generation Using Prototype PV Installations

Figure 9:
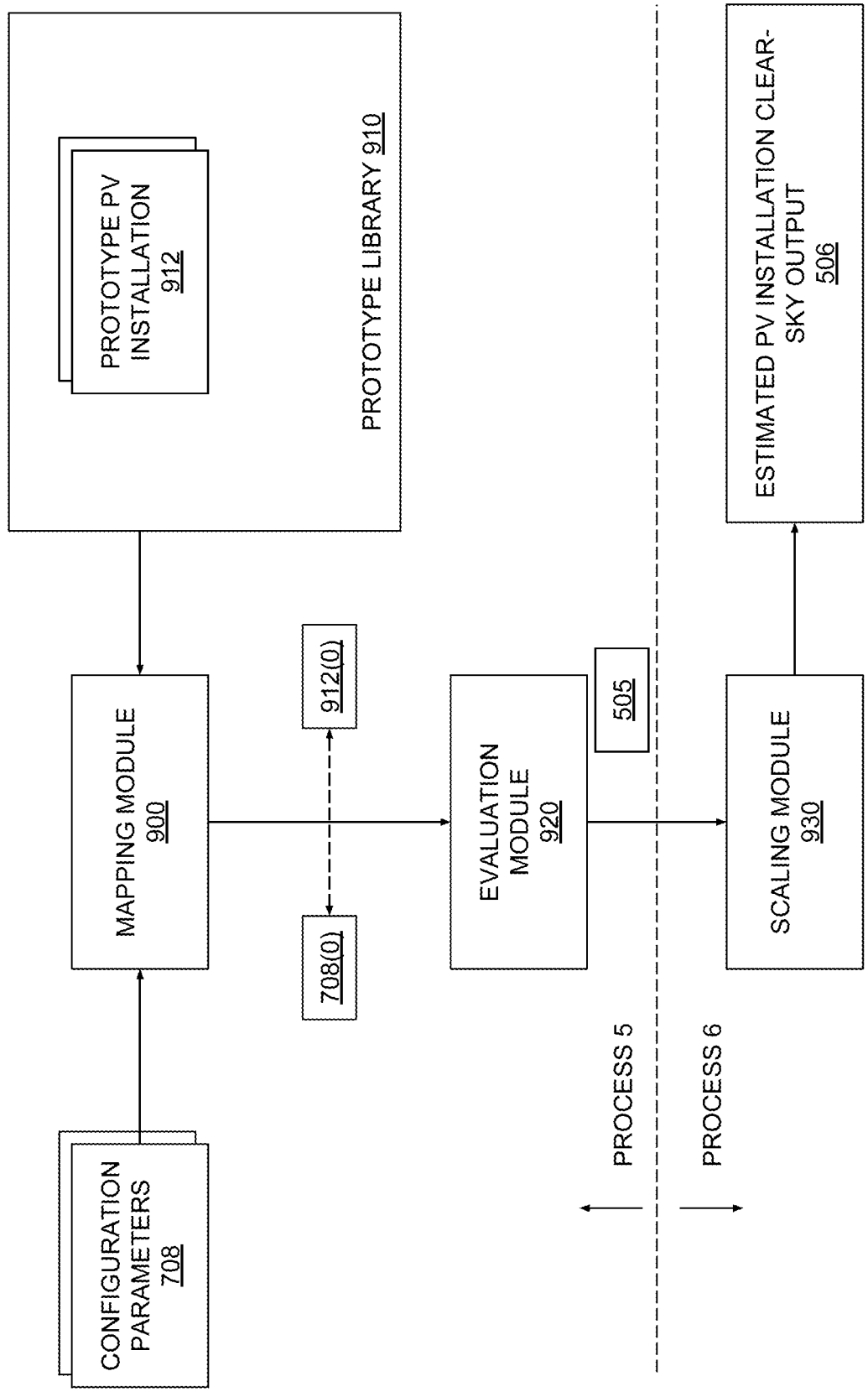
FIG. 9 is a more detailed illustration of process 5 and process 6 of FIG. 5, according to various embodiments.

FIG. 9 is a more detailed illustration of process 5 and process 6 of FIG. 5, according to various embodiments. As discussed above in conjunction with FIG. 5, via process 5, forecast engine 432 maps each PV installation 212 to a particular prototype PV installation. For a given PV installation 212, forecast engine 432 then determines the solar power generation output of the corresponding prototype PV installation under clear sky conditions (set forth in prototype PV installation clear-sky output 505). Subsequently, via process 6, forecast engine 432 scales the clear-sky solar power generation output of the corresponding prototype PV installation based on one or more configuration parameters associated with the given PV installation 212. With these techniques, forecast engine 432 generates estimated PV installation clear-sky output 506. Forecast engine 432 generates the solar power generation forecasts set forth in forecast data 509 based, at least in part, on estimated PV installation clear-sky output 506. Accordingly, processes 5 and 6 are important steps towards generating accurate solar power generation forecasts.

As shown, process 5 includes a mapping module 900, a prototype library 910, and an evaluation module 920, and process 6 includes a scaling module 930. In operation, mapping module 900 obtains configuration parameters 708 associated with PV installations 212. Configuration parameters 708 may be included in SR-to-PV installation mapping 502 of FIG. 5, as previously mentioned. Configuration parameters 708 indicate the size, operational characteristics, and solar region of each PV installation 212, in addition to the location information discussed previously.

Mapping module 900 analyzes the configuration parameters 708 associated with PV installations 212 and then maps each PV installation 212 to a specific prototype PV installation 912 within prototype library 910 that has a similar size and/or similar operational characteristics. A given prototype PV installation 912 includes a parametric model of a PV installation that can be evaluated, for a given point in time and based on a specific solar region, to generate an estimated solar power generation level under clear-sky conditions. Evaluation module 920 evaluates the parametric models for each prototype PV installation 902 identified in the manner described to generate prototype PV installation clear-sky output 505.

In an example of the above process, mapping module 900 analyzes configuration parameters 708(0) associated with a given PV installation 212. Mapping module 900 then determines that prototype PV installation 912(0) has a similar size and/or set of operational characteristics as those set forth in configuration parameters 708(0). Mapping module 900 outputs configuration parameters 708(0) and prototype PV installation 921(0) to evaluation module 920. Evaluation module 920 then evaluates a parametric model associated with prototype PV installation 912(0) to generate the prototype PV installation clear-sky output for prototype PV installation 912(0). The parametric model accounts for a current level of insolation within the solar region associated with the given PV installation 212, various predicted system losses, and predicted inverter efficiency, among other things. Via this approach, evaluation module 920 generates prototype PV installation clear-sky output 505.

Scaling module 930 then modifies prototype PV installation clear-sky output 505 to account for various environmental factors, including a shading factor, a soiling factor, a solar region temperature, and one or more operating efficiency degradation factors, among others. Scaling module 930 also modifies each prototype PV installation clear-sky output relative to the configuration of the associated PV installation 212. For example, suppose configuration parameters 708(0) for the PV installation 212 discussed above indicates that PV installation 212 includes twelve solar panels. Scaling module 930 could then scale the associated prototype PV installation clear-sky output by a factor of twelve. In this manner, scaling module 930 generates estimated PV installation clear-sky output 506.

Via the above techniques, forecast engine 432 uses prototype PV installations 912 as a proxy for evaluating corresponding PV installations 212 to generate estimated PV installation clear-sky output 506. These techniques are described in greater detail below in conjunction with FIG. 10.

Figure 10:
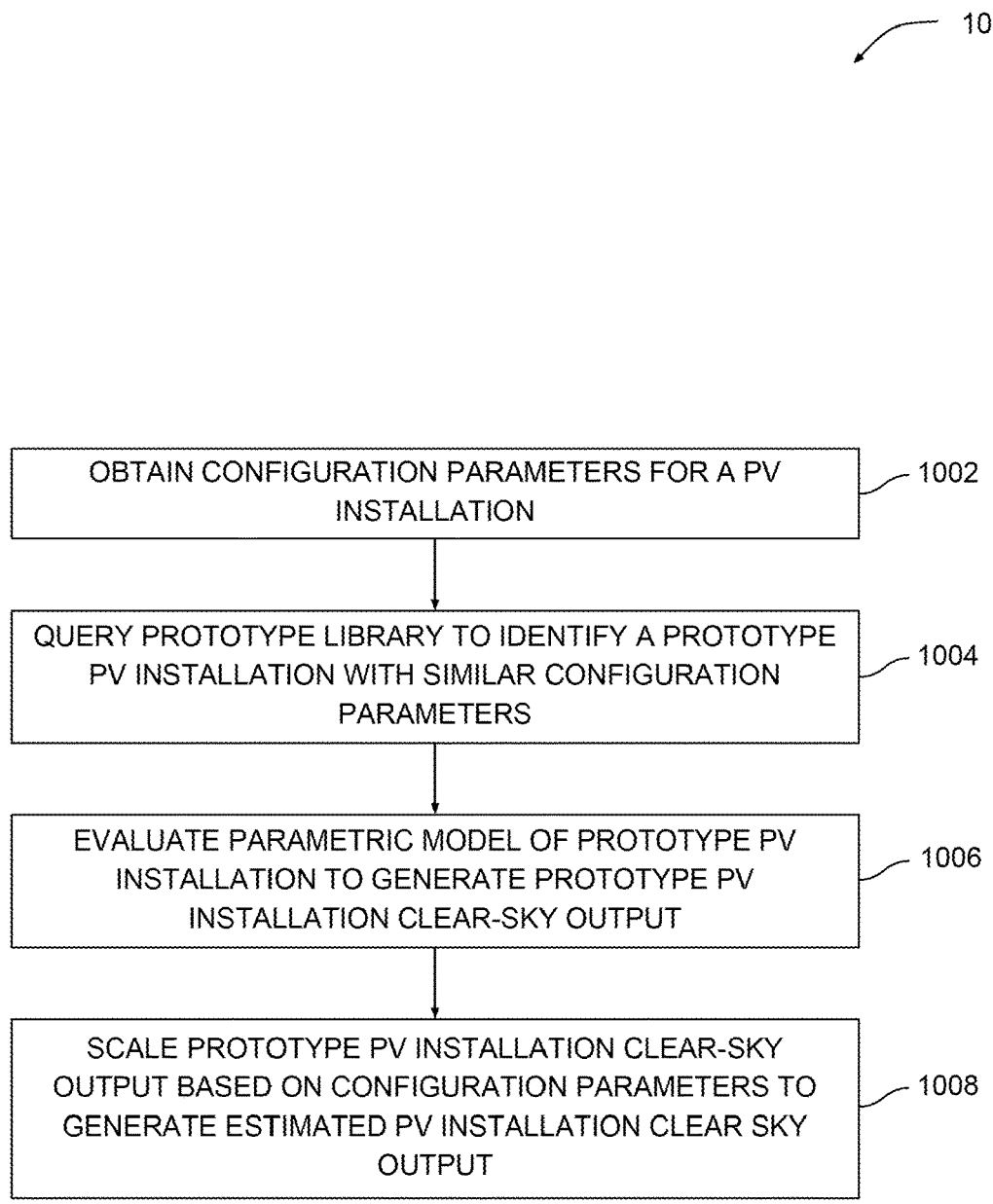
FIG. 10 is a flow diagram of method steps for computing the solar power generation output of a photovoltaic installation, according to various embodiments.

FIG. 10 is a flow diagram of method steps for computing the solar power generation output of a PV installation, according to various embodiments. Although the method steps are described in conjunction with the systems of FIGS. 1-6 and 9, persons skilled in the art will understand that any system configured to perform the method steps in any order falls within the scope of the present embodiments.

As shown, a method 1000 begins at step 1002, where forecast engine 432 obtains configuration parameters for a PV installation 212. The configuration parameters for a PV installation 212 are included in SR-to-PV installation mapping 502 of FIG. 5 and indicate the size of the PV installation 212, the operational characteristics of the PV installation 212, and the solar region assigned to the PV installation 212, among other things.

At step 1004, forecast engine 432 queries a prototype library to identify a prototype PV installation 212 with similar configuration parameters to those obtained at step 1002. In particular, forecast engine 432 analyzes each prototype PV installation included within the prototype library and compares the size and operational characteristics of those prototype PV installations to the size and operational characteristics set forth in the configuration parameters obtained at step 1004. Forecast engine 432 then identifies the prototype PV installation with the most similar size and/or operational characteristics.

At step 1006, forecast engine 432 evaluates a parametric model of the prototype PV installation determined at step 1004 to generate a prototype PV installation clear-sky output. In doing so, forecast engine 432 determines the current level of insolation within the solar region associated with the PV installation 212, various predicted system losses, and predicted inverter efficiency, then computes the prototype PV installation clear-sky output based on this data. Forecast engine 432 generally performs the above steps when executing process 5 of FIG. 5 in order to generate prototype PV installation clear-sky output 505.

At step 1008, forecast engine 432 scales the prototype PV installation clear-sky output generated at step 1006 based on the configuration parameters obtained at step 1002 to generate an estimated PV installation clear sky output. For example, forecast engine 432 could determine that the PV installation 212 includes N solar panels, and then scale the prototype PV installation clear-sky output by a factor of N. In addition, forecast engine 432 may modify the prototype PV installation clear-sky output based on various environmental factors, including shading factors, soiling factors, and so forth. Forecast engine 432 generally performs the above steps when executing process 6 of FIG. 5 in order to generate estimated PV installation clear-sky output 506.

Forecast engine 432 executes processes 5 and 6 described above in conjunction with FIGS. 5 and 7-8 when performing the method 800 to estimate the output of PV installations 212 under clear-sky conditions. These techniques improve the accuracy with which forecast engine 432 can produce solar power generation forecasts set forth in forecast data 509.

Quantifying Cloud Cover Using MD Indices

Figure 11:
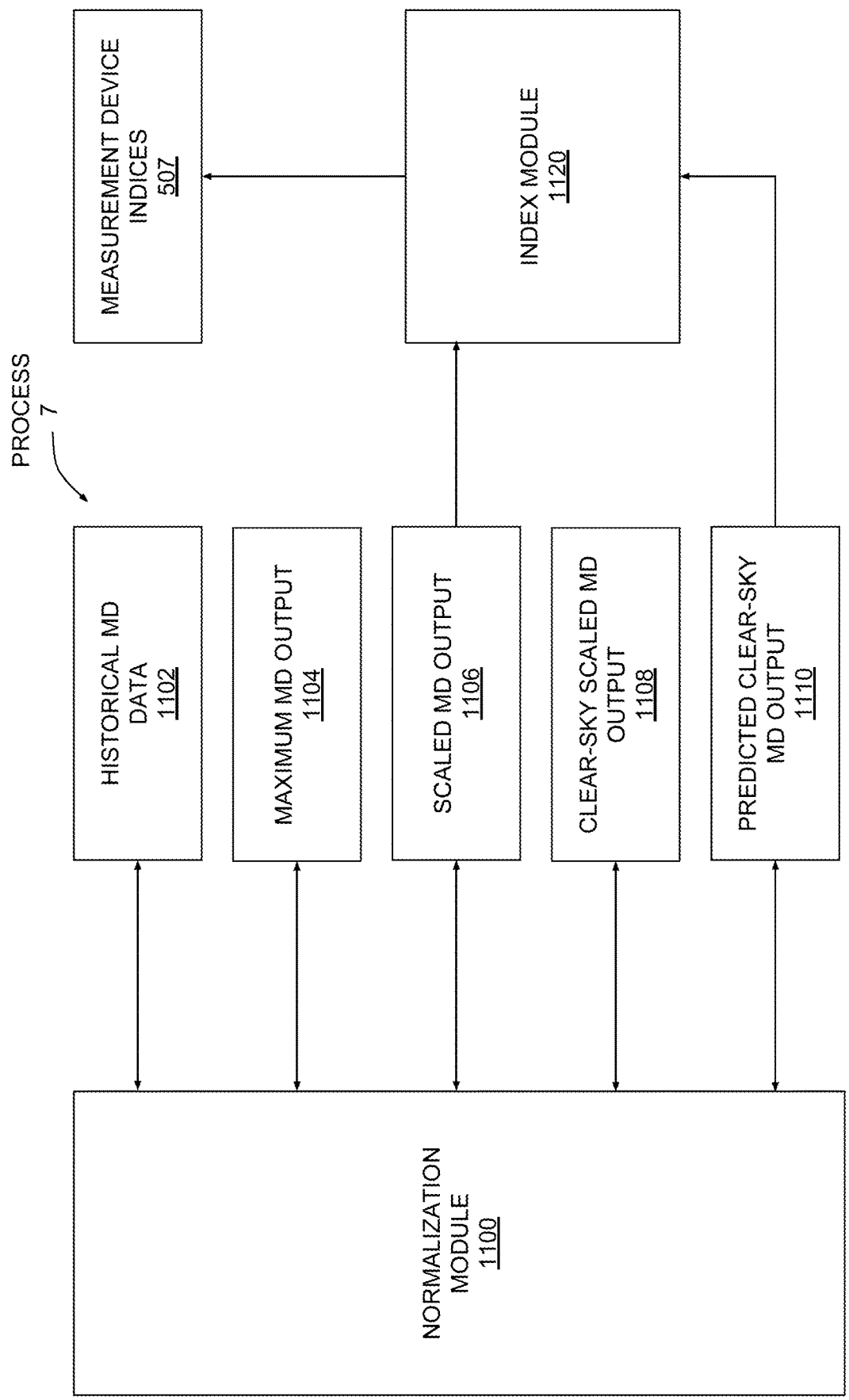
FIG. 11 is a more detailed illustration of process 7 of FIG. 5, according to various embodiments.

FIG. 11 is a more detailed illustration of process 7 of FIG. 5, according to various embodiments. As described above in conjunction with FIG. 5, forecast engine 432 executes process 7 to generate measurement device indices 507 based on measurement data 334. A given measurement device index is a value between zero and one that represents the current level of cloud cover at the location of a specific MD node 230. Based on measurement device indices 507, forecast engine 432 modifies PV installation clear-sky output 506 to compensate for cloud cover interference, thereby leading to more accurate estimates of current solar power generation. Accordingly, process 7 is an important step towards generating accurate solar power generation forecasts.

As shown, process 7 includes a normalization module 1100 and an index module 1120. In operation, normalization module 1100 obtains historical MD data 1102 associated with a given MD node 230. Historical MD data 1102 includes an aggregation of measurement data 334 generated by the given MD node 230 over a previous interval (typically one year). Normalization module 1100 processes historical MD data 1102 and determines the maximum output of the given MD node 230 to generate maximum MD output 1104. Normalization module 1100 then scales a portion of measurement data 334 associated with a recent interval based on maximum MD output 1104 to generate scaled MD output 1106. Normalization module 1100 scales measurement data 334 by diving the measurements included in measurement data 334 by maximum MD output 1104.

Normalization module 1100 then applies a filter to scaled MD output 1106 to filter out lower measurements that are potentially recorded on cloudy days. For example, normalization module 1100 could filter scaled MD output 1106 using a sliding window that replaces a specific value within the sliding window with the maximum value within the sliding window. Normalization module 1100 filters scaled MD output 1106 in this manner to generate clear-sky scaled MD output 1108. Normalization module 1100 then performs a nonlinear regression based on clear-sky scaled MD output 1108 to predict the clear-sky output of the given MD node 230 at a current point in time, thereby generating predicted clear-sky MD output 1110.

Index module 1120 obtains scaled MD output 1106 and predicted clear-sky MD output 1110 from normalization module 1100 and then computes a ratio between these two values to generate a measurement device index for the given MD node 230. For example, index module 1120 could divide scaled MD output 1106 by predicted clear-sky MD output 1110 to generate a measurement device index between zero and one. The measurement device index would indicate how closely a current measurement generated by the given MD node 230 approaches a clear-sky output predicted for the MD node 230.

In the manner described, forecast engine 432 executes process 7 to generate, for each MD node 230 and at any given point in time, an index that represents the current level of cloud cover. The techniques described above for generating measurement device indices 507 are described in greater detail below in conjunction with FIG. 12.

Figure 12:
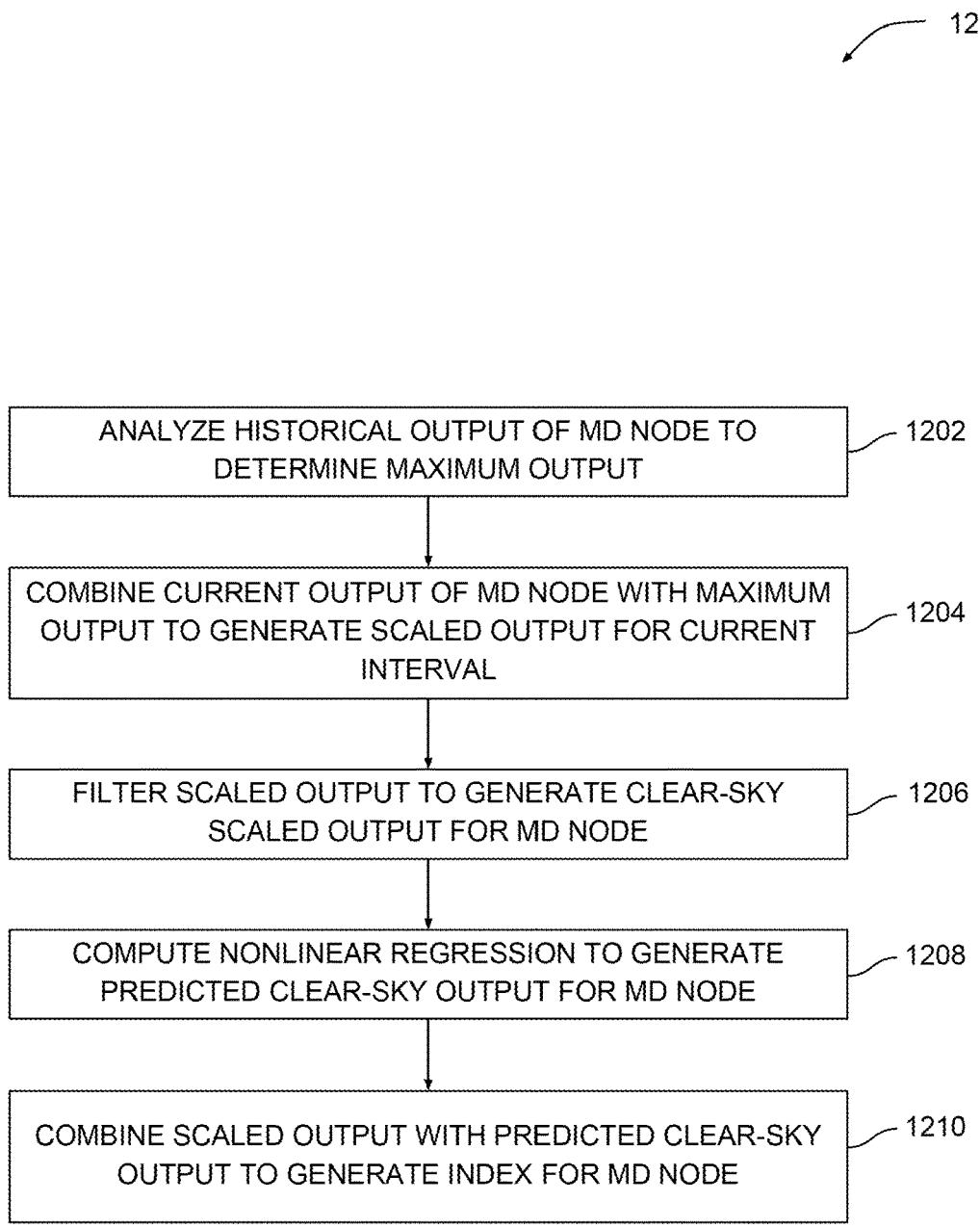
FIG. 12 is a flow diagram of method steps for measuring the amount of cloud cover within a geographical area, according to various embodiments.

FIG. 12 is a flow diagram of method steps for measuring the amount of cloud cover within a geographical area, according to various embodiments. Although the method steps are described in conjunction with the systems of FIGS. 1-6 and 11, persons skilled in the art will understand that any system configured to perform the method steps in any order falls within the scope of the present embodiments.

As shown, a method 1200 begins at step 1202, where forecast engine 432 of FIG. 5 analyzes historical data associated with an MD node 230 to determine the maximum output for the given MD node 230 over a previous interval. The historical data includes a time series of data points collected by a PV device 360 associated with the given MD node 230. In practice, the previous interval is one year, although other intervals can also be implemented.

At step 1204, forecast engine 432 combines the current output of the MD node 230 with the maximum output determined at step 1202 to generate a scaled output for the MD node 230 for a current interval. For example, forecast engine 432 could divide each data point included in a recent portion of measurement data 334 by the maximum output determined at step 1202 to generate a series of scaled data points.

At step 1206, forecast engine 432 filters the scaled output generated at step 1204 to generate a clear-sky scaled output for the MD node 230. In doing so, forecast engine 432 computes a maximum value of the scaled output over a sliding interval in order to filter outlier data points. These outlier data points potentially result due to intermittent cloud cover. The sliding interval could include any number of data points, although in practice a sliding window that includes three data points is used.

At step 1208, forecast engine 432 computes a nonlinear regression based on the clear-sky scaled output generated at step 1206 to generate a predicted clear-sky output for the MD node 230 at a given point in time. The predicted clear-sky output for the MD node 230 indicates what the output of the MD node 230 should be at the current day and time within the corresponding solar region under clear-sky conditions.

At step 1210, forecast engine 432 combines the scaled output determined at step 1204 with the predicted clear-sky output determined at step 1208 to generate an index for the MD node 230. In particular, forecast engine 432 computes a ratio between the scaled output and the predicted clear-sky output to generate the index. The compute index is a value between zero and one that indicates an estimate for the current level of cloud cover at the location of the MD node 230.

Forecast engine 432 executes process 7 described above in conjunction with FIGS. 5, 6, and 11 to perform the method 1200, thereby generating a measurement device index 507 for each MD node 230. Forecast engine 432 can perform the above steps in real time as frequently as needed to generate indices over short time scales, thereby providing process 8 with real-time inputs for computing estimated PV installation output 508.

Referring generally to FIGS. 7-12, the techniques described above in conjunction with these Figures represent important operations in the overarching process of generating solar power generation forecasts set forth in forecast data 509, and can therefore facilitate more effective and accurate solar power generation forecasting.

In sum, a forecast engine is configured to forecast solar power generation within a given geographical area. The forecast engine identifies a set of measurement device (MD) nodes within the geographical area that are capable of measuring solar insolation and assigns one or more MD nodes to each photovoltaic (PV) installation in the geographical area. For any given PV installation, the forecast engine then determines a prototype PV installation that can be used to estimate clear-sky solar power generation. The forecast engine then generates, based on real-time measurement data output by the MD nodes, an MD index for each MD node to represent a current amount of cloud cover. The forecast engine scales the clear-sky solar power generation output of each PV installation based on the MD indices generated for the assigned MD nodes to generate an estimated PV installation output for each PV installation. Based on the estimated PV installation output, and based on various historical data and/or real-time data, the forecast engine generates a solar power generation forecast for the geographical area.

At least one technological advantage of the disclosed techniques relative to the prior art is that solar power generation can be accurately predicted within a given geographical area, allowing electricity providers to scale electricity production to meet anticipated demand within the geographical area. As a result, electricity providers can supply electricity to consumers with greater efficiency. Another technological advantage of the disclosed techniques is that solar power generation can be approximated with reasonable accuracy independently of environmental factors such as cloud cover, allowing electricity providers to scale electricity production independently of seasonal changes, weather patterns, and so forth. Yet another technological advantage of the disclosed techniques is that the current level of cloud cover at a given location can be accurately estimated and used to improve the accuracy of solar power generation estimations that do not consider environmental factors, such as cloud cover. These technological advantages represent one or more technological advancements over prior art approaches.

1. Some embodiments include a computer-implemented method, comprising processing a first data set received from a first measurement device to determine that a first insolation measurement generated by the first measurement device indicates a first insolation level associated with a first photovoltaic installation, processing a second data set received from a first prototype photovoltaic installation to determine that a first estimated solar power generation level corresponding to the first prototype photovoltaic installation indicates a first solar power generation level that is output by the first photovoltaic installation during exposure to solar energy having the first insolation level, and generating a solar power generation forecast for a geographical area based, at least in part, on the first insolation measurement and the first solar power generation level.

2. The computer-implemented method of clause 1, further comprising mapping the first measurement device to the first photovoltaic installation by generating a first score for the first measurement device, and determining that the first score exceeds all other scores generated for any other measurement devices.

3. The computer-implemented method of any of clauses 1-2, wherein generating the first score comprises determining a proximity value between the first measurement device and the first photovoltaic installation, determining an angular offset value between a photovoltaic device coupled to the first measurement device and a photovoltaic panel coupled to the first photovoltaic installation, determining a data quality value based on at least one measurement factor associated with the first measurement device, and combining the proximity value, the angular offset value, and the data quality value to generate the first score.

4. The computer-implemented method of any of clauses 1-3, further comprising mapping the first prototype photovoltaic installation to the first photovoltaic installation by determining that the first prototype photovoltaic installation is configured according to at least one configuration parameter associated with the first photovoltaic installation.

5. The computer-implemented method of any of clauses 1-4, wherein determining that the first prototype photovoltaic installation is configured according to the at least one configuration parameter comprises querying a library of prototype photovoltaic installations based on the at least one configuration parameter to generate a query result that indicates the first prototype photovoltaic installation.

6. The computer-implemented method of any of clauses 1-5, further comprising evaluating a parametric function of the first prototype photovoltaic installation to generate the first estimated solar power generation level.

7. The computer-implemented method of any of clauses 1-6, wherein generating the solar power generation forecast comprises generating a first index for the first measurement device based on the first insolation measurement, generating a first clear-sky solar power generation level for the first photovoltaic installation based on the first estimated solar power generation level, combining the first index with the first clear-sky solar power generation level to generate the first solar power generation level, and extrapolating the first solar power generation level over a first interval of time to generate the solar power generation forecast comprises 8.

9. The computer-implemented method of any of clauses 1-8, further comprising applying a sliding filter to the scaled output level to generate a clear-sky scaled output level for the first measurement device, wherein the regression is further computed based on the clear-sky scaled output level.

10. The computer-implemented method of any of clauses 1-9, wherein generating the first clear-sky solar power generation level for the first photovoltaic installation comprises scaling the first estimated solar power generation level based on a number of photovoltaic panels included in the first photovoltaic installation.

11. Some embodiments include a non-transitory computer-readable medium storing program instructions that, when executed by a processor, causes the processor to perform the steps of processing a first data set received from a first measurement device to determine that a first insolation measurement generated by the first measurement device indicates a first insolation level associated with a first photovoltaic installation, processing a second data set received from a first prototype photovoltaic installation to determine that a first estimated solar power generation level corresponding to the first prototype photovoltaic installation indicates a first solar power generation level that is output by the first photovoltaic installation during exposure to solar energy having the first insolation level, and generating a solar power generation forecast for a geographical area based, at least in part, on the first insolation measurement and the first solar power generation level.

12. The non-transitory computer-readable medium of clause 11, further comprising the step of mapping the first measurement device to the first photovoltaic installation by generating a first score for the first measurement device, and determining that the first score exceeds all other scores generated for any other measurement devices.

13. The non-transitory computer-readable medium of any of clauses 11-12, wherein generating the first score comprises determining a proximity value between the first measurement device and the first photovoltaic installation, determining an angular offset value between a photovoltaic device coupled to the first measurement device and a photovoltaic panel coupled to the first photovoltaic installation, determining a data quality value based on at least one measurement factor associated with the first measurement device, and combining the proximity value, the angular offset value, and the data quality value to generate the first score.

14. The non-transitory computer-readable medium of any of clauses 11-13, further comprising the step of mapping the first prototype photovoltaic installation to the first photovoltaic installation by determining that the first prototype photovoltaic installation is configured according to at least one configuration parameter associated with the first photovoltaic installation.

15. The non-transitory computer-readable medium of any of clauses 11-14, wherein determining that the first prototype photovoltaic installation is configured according to the at least one configuration parameter comprises querying a library of prototype photovoltaic installations based on the at least one configuration parameter to generate a query result that indicates the first prototype photovoltaic installation.

16. The non-transitory computer-readable medium of any of clauses 11-15, further comprising the step of evaluating a parametric function of the first prototype photovoltaic installation to generate the first estimated solar power generation level.

17. The non-transitory computer-readable medium of any of clauses 11-16, wherein the step of generating the solar power generation forecast comprises generating a first index for the first measurement device based on the first insolation measurement, generating a first clear-sky solar power generation level for the first photovoltaic installation by multiplying the first estimated solar power generation level by a number of photovoltaic panels included in the first photovoltaic installation, combining the first index with the first clear-sky solar power generation level to generate the first solar power generation level, and extrapolating the first solar power generation level over a first interval of time to generate the solar power generation forecast comprises 18.

19. The non-transitory computer-readable medium of any of clauses 11-18, further comprising applying a window function to the scaled output level to generate a clear-sky scaled output level for the first measurement device, wherein the regression is further computed based on the clear-sky scaled output level.

20. Some embodiments include a system, comprising a memory that stores a forecast engine, and a processor that, when executing the forecast engine, is configured to perform the steps of processing a first data set received from a first measurement device to determine that a first insolation measurement generated by the first measurement device indicates a first insolation level associated with a first photovoltaic installation, processing a second data set received from a first prototype photovoltaic installation to determine that a first estimated solar power generation level corresponding to the first prototype photovoltaic installation indicates a first solar power generation level that is output by the first photovoltaic installation during exposure to solar energy having the first insolation level, and generating a solar power generation forecast for a geographical area based, at least in part, on the first insolation measurement and the first solar power generation level.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," "system," or "computer." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present invention of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method, comprising:
   determining, by a computing device, one or more configuration parameters of a photovoltaic (PV) installation;
   selecting, by the computing device based on the one or more configuration parameters, a prototype PV installation from a plurality of prototype PV installations;
   generating, by the computing device, a clear-sky solar power generation level for the selected prototype PV installation;
   scaling, by the computing device, the clear-sky solar power generation level for the selected prototype PV installation to generate an estimated clear-sky solar power generation level for the PV installation; and
   performing, by the computing device based on the estimated clear-sky solar power generation level for the PV installation, real-time solar power generation forecasting.

2. The method of claim 1, wherein the one or more configuration parameters include one or more of a size of the PV installation, an operational characteristic of the PV installation, or a solar region associated with the PV installation.

3. The method of claim 1, wherein selecting the prototype PV installation based on the one or more configuration parameters comprises selecting the prototype PV installation having a size that is closest to a size of the PV installation.

4. The method of claim 1, wherein selecting the prototype PV installation based on the one or more configuration parameters comprises selecting the prototype PV installation having an operational characteristic that is closest to an operational characteristic of the PV installation.

5. The method of claim 1, wherein generating the clear-sky solar power generation level for the selected prototype PV installation comprises determining the clear-sky solar power generation level based on a parametric model of the selected prototype PV installation.

6. The method of claim 1, wherein generating the clear-sky solar power generation level for the selected prototype PV installation comprises determining the clear-sky solar power generation level based on a current level of insolation within a solar region associated with the PV installation.

7. The method of claim 1, wherein generating the clear-sky solar power generation level for the selected prototype PV installation comprises determining the clear-sky solar power generation level based on a predicted inverter efficiency associated with the PV installation.

8. The method of claim 1, wherein generating the clear-sky solar power generation level for the selected prototype PV installation comprises determining the clear-sky solar power generation level based on a predicted system loss associated with the PV installation.

9. The method of claim 1, wherein scaling the clear-sky solar power generation level for the selected prototype PV installation comprises modifying the clear-sky solar power generation level based on one or more environmental factors associated with the PV installation or a number of solar panels included in the PV installation.

10. The method of claim 1, further comprising determining, by the computing device based on a current level of cloud cover in a target geographical area and the estimated clear-sky solar power generation level, a solar power generation level for the PV installation in the target geographical area.

11. One or more non-transitory computer-readable media storing program instructions that, when executed by one or more processors associated with a forecasting engine, cause the one or more processors to perform a method comprising:
   determining one or more system characteristics associated with a solar power generation system;
   selecting a prototype solar power generation system from a plurality of prototype solar power generation systems based on the one or more system characteristics;
   generating a clear-sky solar power generation level for the selected prototype solar power generation system;
   modifying the clear-sky solar power generation level for the selected prototype solar power generation system to generate an estimated clear-sky solar power generation level for the solar power generation system; and performing, based on the estimated clear-sky solar power generation level for the solar power generation system, real-time solar power generation forecasting.

12. The one or more non-transitory computer-readable media of claim 11, wherein the one or more system characteristics include one or more of a size of the solar power generation system, an operational characteristic of the solar power generation system, or a solar region associated with the solar power generation system.

13. The one or more non-transitory computer-readable media of claim 11, wherein generating the clear-sky solar power generation level for the selected prototype solar power generation system further comprises determining the clear-sky solar power generation level based on a parametric model of the selected prototype solar power generation system.

14. The one or more non-transitory computer-readable media of claim 11, wherein generating the clear-sky solar power generation level for the selected prototype solar power generation system comprises determining the clear-sky solar power generation level based on an amount of solar radiation within a solar region associated with the solar power generation system.

15. The one or more non-transitory computer-readable media of claim 11, wherein modifying the clear-sky solar power generation level for the solar power generation system comprises modifying the clear-sky solar power generation level based on one or more environmental factors associated with the solar power generation system.

16. The one or more non-transitory computer-readable media of claim 11, wherein modifying the clear-sky solar power generation level for the solar power generation system comprises scaling the clear-sky solar power generation level based on a number of solar panels included in the solar power generation system.

17. A forecasting system comprising:
a memory storing instructions; and
one or more processors;
wherein when the one or more processors execute the stored instructions, the one or more processors are configured to:
determine one or more configuration parameters associated with a plurality of solar panels;
select a prototype installation of solar panels from a plurality of prototype installations of solar panels based on the one or more configuration parameters;
generate a clear-sky solar power output for the selected prototype installation of solar panels;
generate an estimated clear-sky solar power output for the plurality of solar panels based on the clear-sky solar power output for the selected prototype installation of solar panels; and
perform, based on the estimated clear-sky solar power output for the plurality of solar panels, real-time solar power generation forecasting.

18. The forecasting system of claim 17, wherein the one or more configuration parameters include one or more of a number of solar panels included in the plurality of solar panels, an operational characteristic of the plurality of solar panels, or a solar region associated with the plurality of solar panels.

19. The forecasting system of claim 17, wherein to generate the estimated clear-sky solar power output for the plurality of solar panels, the one or more processors are configured to scale the clear-sky solar power output for the selected prototype installation of solar panels based on a number of solar panels included in the plurality of solar panels.

20. The forecasting system of claim 17, wherein to generate the estimated clear-sky solar power output for the plurality of solar panels, the one or more processors are configured to modify the clear-sky solar power output for the selected prototype installation of solar panels based on one or more environmental factors associated with the plurality of solar panels.

* * * * *